(12) United States Patent
Bothe et al.

(10) Patent No.: US 11,791,389 B2
(45) Date of Patent: Oct. 17, 2023

(54) RADIO FREQUENCY TRANSISTOR AMPLIFIERS HAVING WIDENED AND/OR ASYMMETRIC SOURCE/DRAIN REGIONS FOR IMPROVED ON-RESISTANCE PERFORMANCE

(71) Applicant: Wolfspeed, Inc., Durham, NC (US)

(72) Inventors: Kyle Bothe, Cary, NC (US); Jia Guo, Apex, NC (US); Jeremy Fisher, Raleigh, NC (US); Scott Sheppard, Chapel Hill, NC (US)

(73) Assignee: Wolfspeed, Inc., Durham, NC (US)

( * ) Notice: Subject to any disclaimer, the term of this patent is extended or adjusted under 35 U.S.C. 154(b) by 288 days.

(21) Appl. No.: 17/144,346

(22) Filed: Jan. 8, 2021

(65) Prior Publication Data
US 2022/0223700 A1 Jul. 14, 2022

(51) Int. Cl.
*H01L 29/417* (2006.01)
*H01L 23/66* (2006.01)
(Continued)

(52) U.S. Cl.
CPC ........ *H01L 29/41775* (2013.01); *H01L 23/66* (2013.01); *H01L 29/2003* (2013.01);
(Continued)

(58) Field of Classification Search
CPC ............... H01L 29/41775; H01L 23/66; H01L 29/2003; H01L 29/402; H01L 29/7786; H01L 2223/6644; H01L 2223/6683; H01L 29/4175; H01L 29/0843; H01L 29/41758; H01L 2224/32245; H01L 2224/48091; H01L 2224/48247; H01L 2224/73265;
(Continued)

(56) References Cited

U.S. PATENT DOCUMENTS 7,419,892 B2 9/2008 Sheppard et al.
7,875,537 B2 1/2011 Suvorov et al.
(Continued)

OTHER PUBLICATIONS

"PCT Search Report and Written Opinion in corresponding patent application No. PCTUS22011023 dated Jun. 24, 2022, 22 pages".
(Continued)

*Primary Examiner* — Mohammed R Alam
(74) *Attorney, Agent, or Firm* — Myers Bigel, P.A.

(57) ABSTRACT

A gallium nitride-based RF transistor amplifier comprises a semiconductor layer structure comprising a barrier layer on a channel layer, first and second source/drain regions in the semiconductor layer structure, first and second source/drain contacts on the respective first and second source/drain regions, and a longitudinally-extending gate finger that is between the first and second source/drain contacts. The first and second source/drain contacts each has an inner sidewall that faces the gate finger and an opposed outer sidewall. The first source/drain region extends a first distance from a lower edge of the inner sidewall of the first source/drain contact towards the second source/drain region along a transverse axis that extends parallel to a plane defined by the upper surface of the semiconductor layer structure, and extends a second, smaller distance from a lower edge of the outer sidewall of the first source/drain contact away from the second source/drain region.

26 Claims, 10 Drawing Sheets

(51) Int. Cl.
*H01L 29/20* (2006.01)
*H01L 29/40* (2006.01)
*H01L 29/778* (2006.01)
*H03F 3/195* (2006.01)
*H03F 3/213* (2006.01)

(52) U.S. Cl.
CPC ........ *H01L 29/402* (2013.01); *H01L 29/7786* (2013.01); *H03F 3/195* (2013.01); *H03F 3/213* (2013.01); *H01L 2223/6644* (2013.01); *H01L 2223/6683* (2013.01); *H03F 2200/451* (2013.01)

(58) Field of Classification Search
CPC ... H01L 2924/181; H03F 3/195; H03F 3/213; H03F 2200/451
See application file for complete search history.

(56) References Cited

U.S. PATENT DOCUMENTS

| | | | |
|---|---|---|---|
| 8,823,057 | B2 | 9/2014 | Sheppard et al. |
| 9,318,594 | B2 | 4/2016 | Sheppard et al. |
| 9,711,633 | B2 | 7/2017 | Sheppard et al. |
| 9,984,881 | B2 | 5/2018 | Sheppard et al. |
| 2010/0117155 | A1* | 5/2010 | Kitakado .......... H01L 29/78621 257/E27.06 |
| 2011/0092057 | A1 | 4/2011 | Suvorov |
| 2013/0020632 | A1* | 1/2013 | Disney ................ H01L 29/0847 257/E21.409 |
| 2015/0279722 | A1 | 10/2015 | Kikuchi |
| 2020/0135908 | A1* | 4/2020 | Nanjo ................. H01L 29/2003 |

OTHER PUBLICATIONS

"Taiwan Search Report in corresponding patent application No. 111100659, dated Sep. 12, 2022, 7 pages".

* cited by examiner

RADIO FREQUENCY TRANSISTOR AMPLIFIERS HAVING WIDENED AND/OR ASYMMETRIC SOURCE/DRAIN REGIONS FOR IMPROVED ON-RESISTANCE PERFORMANCE

FIELD

The inventive concepts described herein relate to microelectronic devices and, more particularly, to gallium nitride-based radio frequency ("RF") transistor amplifiers.

BACKGROUND

Electrical circuits requiring high power handling capability while operating at high frequencies, such as traditional cellular communication frequency bands (0.5-2.7 GHz), S-band (3 GHz), X-band (10 GHz), Ku-band (12-18 GHz), K-band (18-27 GHz), Ka-band (27-40 GHz) and V-band (40-75 GHz) have become more prevalent. In particular, there is now high demand for RF transistor amplifiers that are used to amplify RF signals at frequencies of, for example, 500 MHz and higher (including microwave frequencies). These RF transistor amplifiers often need to exhibit high reliability, good linearity and handle high output power levels.

RF transistor amplifiers may be implemented in silicon or wide bandgap semiconductor materials, such as silicon carbide ("SiC") and Group III nitride materials. Herein, the term "wide bandgap" refers to semiconductor materials having a bandgap of greater than 1.40 eV. As used herein, the term "Group III nitride" refers to those semiconducting compounds formed between nitrogen and the elements in Group III of the periodic table, usually aluminum (Al), gallium (Ga), and/or indium (In). The term also refers to ternary and quaternary compounds, such as AlGaN and AlInGaN. These compounds have empirical formulas in which one mole of nitrogen is combined with a total of one mole of the Group III elements Silicon-based RF transistor amplifiers are typically implemented using laterally diffused metal oxide semiconductor ("LDMOS") transistors. Silicon LDMOS RF transistor amplifiers can exhibit high levels of linearity and may be relatively inexpensive to fabricate. Group III nitride-based RF transistor amplifiers are typically implemented as High Electron Mobility Transistors ("HEMT") and are primarily used in applications requiring high power and/or high frequency operation where LDMOS RF transistor amplifiers may have inherent performance limitations.

RF transistor amplifiers may include one or more amplification stages, with each stage typically implemented as a transistor amplifier. In order to increase the output power and current handling capabilities, RF transistor amplifiers are typically implemented in a "unit cell" configuration in which a large number of individual "unit cell" transistors are arranged electrically in parallel. An RF transistor amplifier may be implemented as a single integrated circuit chip or "die," or may include a plurality of dies. When multiple RF transistor amplifier die are used, they may be connected in series and/or in parallel.

One important performance parameter for a Group III nitride-based RF transistor amplifier is the drain-to-source resistance during on-state operation ($R_{ds\text{-}on}$), which is also commonly referred to as the "on-resistance." The on-resistance may impact various performance parameters of the RF transistor amplifier, including its power added efficiency. Group III nitride-based RF transistor amplifiers also have various parasitic intrinsic capacitances within the device including the drain-to-source capacitance ("$C_{ds}$") and the gate-to-drain capacitance ("$C_{gd}$"). These parasitic intrinsic capacitances also impact the performance of the RF transistor amplifier.

FIG. 1 is a schematic cross-sectional view of a unit cell transistor 2 of a conventional Group III nitride-based RF transistor amplifier. As shown in FIG. 1, the unit cell 2 includes a gate contact 22, a drain contact 24 and a source contact 26 that are each formed on an upper surface of a semiconductor layer structure 50, with the gate contact 22 being positioned between the drain contact 24 and the source contact 26. A first interlayer insulation layer 30 electrically isolates the gate, drain and source contacts 22, 24, 26 from each other. A second interlayer insulation layer 32 covers the gate contact 22, and a field plate 28 is formed on the second interlayer insulation layer 32. The field plate 28 may be positioned above the semiconductor layer structure 50 in the region between the gate contact 22 and the drain contact 24, and may vertically overlap the gate contact 22. Herein, an element of an RF transistor amplifier "vertically overlaps" another element if an axis that is perpendicular to the top surface of the semiconductor layer structure of the RF transistor amplifier intersects both elements. The field plate 28 may be electrically connected to the source contact 26 by an electrical connection that is outside the cross-sectional view of FIG. 1. A passivation layer 34 covers the field plate 28.

The semiconductor layer structure 50 includes a substrate 52 and a plurality of epitaxial layers that are grown on the substrate 52. The epitaxial layers include at least a channel layer 54 and a barrier layer 56. The barrier layer 56 may comprise a moderately doped n-type semiconductor layer and may comprise one or multiple layers. A heavily doped drain region 64 is formed underneath the drain contact 24, and a heavily doped source region 66 is formed underneath the source contact 26. The heavily doped drain region 64 and the heavily doped source region 66 are each formed in the barrier layer 56, and may optionally extend into the channel layer 54. When the gate, drain and source contacts 22, 24, 26 are connected to suitable direct current bias voltages and an RF signal is applied to the gate contact 22, a two-dimensional electron gas (2DEG) is induced in the channel layer 54 at a junction between the channel layer 54 and the barrier layer 56. The 2DEG acts as a highly conductive channel 62 that allows conduction between the source region 66 and the drain region 64.

SUMMARY

Pursuant to embodiments of the present invention, RF transistor amplifiers are provided that comprise a semiconductor layer structure comprising a gallium nitride-based channel layer and a gallium nitride-based barrier layer that has a higher bandgap than the gallium nitride-based channel layer on an upper surface of the gallium nitride-based channel layer, a first source/drain region in the semiconductor layer structure, a second source/drain region in the semiconductor layer structure, a gate finger on an upper surface of the semiconductor layer structure, the gate finger having a longitudinal axis that extends parallel to the upper surface of the semiconductor layer structure, a first source/drain contact on the first source/drain region, the first source/drain contact having an inner sidewall that faces the gate finger and an outer sidewall opposite the inner sidewall, and a second source/drain contact on the second source/drain region, the second source/drain contact having an inner sidewall that faces the gate finger and an outer sidewall opposite the inner sidewall. The first source/drain region extends a first distance from a lower edge of the inner sidewall of the first source/drain contact towards the second source/drain region along a transverse axis that extends parallel to a plane defined by the upper surface of the semiconductor layer structure, and extends a second distance from a lower edge of the outer sidewall of the first source/drain contact away from the second source/drain region, where the first distance exceeds the second distance.

In example embodiments, the first distance may exceed the second distance by at least 50%, by at least 100%, by at least 150% or by at least 200%.

In some embodiments, the second source/drain region may extend a third distance along the transverse axis from a lower edge of the inner sidewall of the second source/drain contact towards the first source/drain contact, where the first distance exceeds the third distance by at least 100%.

In some embodiments, the first source/drain region may have a first width along the transverse axis and the second source/drain region may have a second width along the transverse axis, where the first width exceeds the second width.

In some embodiments, a ratio of the first distance to a distance between the lower edge of the inner sidewall of the first source/drain contact and a lower edge of a sidewall of the gate finger that faces the first source/drain contact along the transverse axis is at least 0.1.

In some embodiments, the first distance is at least 0.3 microns, and wherein a doping density of the first source/drain region is at least $3\times10^{19}$ dopants/cm$^3$.

In some embodiments, a location where the first source/drain region has a maximum depth is closer to the lower edge of the inner sidewall of the first source/drain contact than it is to the lower edge of the outer sidewall of the first source/drain contact. In such embodiments, a location of a peak doping density of the first source/drain region is closer to the lower edge of the inner sidewall of the first source/drain contact than it is to the lower edge of the outer sidewall of the first source/drain contact.

In some embodiments, the first source/drain region is a drain region and the first source/drain contact is a drain contact.

In some embodiments, the RF transistor amplifier may further comprise a field plate that extends above an upper surface of the gate finger, the field plate being electrically connected to one of the first and second source/drain contacts. The first source/drain region may not intersect a first plane that is interposed between the field plate and a lower surface of the first source/drain contact, where the first plane is perpendicular to an upper surface of the semiconductor layer structure and perpendicular to the transverse axis.

Pursuant to further embodiments of the present invention, RF transistor amplifiers a re provided that include a semiconductor layer structure comprising a gallium nitride-based channel layer and a gallium nitride-based barrier layer that has a higher bandgap than the gallium nitride-based channel layer on an upper surface of the gallium nitride-based channel layer. First and second source/drain regions are formed in the semiconductor layer structure. A gate finger is provided on an upper surface of the semiconductor layer structure, the gate finger having a longitudinal axis that extends parallel to the upper surface of the semiconductor layer structure. A first source/drain contact is provided on the first source/drain region, the first source/drain contact having an inner sidewall that faces the gate finger and an outer sidewall opposite the inner sidewall. A second source/drain contact is provided on the second source/drain region, the second source/drain contact having an inner sidewall that faces the gate finger and an outer sidewall opposite the inner sidewall. A first longitudinal axis extending down a center of an upper surface of the first source/drain region is closer to a first sidewall of the gate finger than is a second longitudinal axis extending down a center of a lower surface of the first source/drain contact.

In some embodiments, a third longitudinal axis extending down a center of an upper surface of the second source/drain region may be transversely aligned with a fourth longitudinal axis extending down a center of a lower surface of the second source/drain contact.

In some embodiments, a third longitudinal axis extending down a center of an upper surface of the second source/drain region may be closer to a second sidewall of the gate finger than is a fourth longitudinal axis extending down a center of a lower surface of the second source/drain contact.

In some embodiments, the first source/drain region may be a drain region and the first source/drain contact may be a drain contact. In such embodiments, the first source/drain region may extend a first distance from a lower edge of the inner sidewall of the first source/drain contact towards the gate finger and the second source/drain region may extend a third distance from a lower edge of the inner sidewall of the second source/drain contact towards the gate finger, where the first distance exceeds the third distance.

In some embodiments, a location of a peak doping density of the first source/drain region may be closer to a lower edge of the inner sidewall of the first source/drain contact than it is to a lower edge of the outer sidewall of the first source/drain contact.

In some embodiments, a location of a peak doping density of the first source/drain region may be at least $3\times10^{19}$ dopants/cm$^3$.

In some embodiments, a location where the first source/drain region has a maximum depth may be closer to a lower edge of the inner sidewall of the first source/drain contact than it is to a lower edge of the outer sidewall of the first source/drain contact.

Pursuant to further embodiments of the present invention, RF transistor amplifiers a re provided that include a semiconductor layer structure comprising a gallium nitride-based channel layer and a gallium nitride-based barrier layer that has a higher bandgap than the gallium nitride-based channel layer on an upper surface of the gallium nitride-based channel layer. First and second source/drain regions are formed in the semiconductor layer structure. A gate finger is provided on an upper surface of the semiconductor layer structure, the gate finger having a longitudinal axis that extends parallel to the upper surface of the semiconductor layer structure. A first source/drain contact is provided on the first source/drain region, the first source/drain contact having an inner sidewall that faces the gate finger and an outer sidewall opposite the inner sidewall. A second source/drain contact is provided on the second source/drain region, the second source/drain contact having an inner sidewall that faces the gate finger and an outer sidewall opposite the inner sidewall. A center of an upper surface of the first source/drain region is offset from a center of a lower surface of the first source/drain contact in a transverse direction by a first amount and a center of an upper surface of the second source/drain region is offset from a center of a lower surface of the second source/drain contact in a transverse direction by a second amount that is different from the first amount.

In some embodiments, the second amount may be zero or approximately zero.

In some embodiments, the RF transistor amplifier may further comprise an inter-metal insulation layer on the upper surface of the semiconductor layer structure between the gate finger and the first source/drain contact, where the center of the upper surface of the first source/drain region directly contacts the inter-metal insulation layer.

In some embodiments, the first source/drain contact may be a drain contact and the first source/drain region may be a drain region. In other embodiments, the first source/drain contact may be a source contact and the first source/drain region may be a source region.

In some embodiments, a width of the first source/drain region along a transverse axis may exceed a width of the second source/drain region along the transverse axis.

In some embodiments, a location of a peak doping density of the first source/drain region may be closer to a lower edge of the inner sidewall of the first source/drain contact than it is to a lower edge of the outer sidewall of the first source/drain contact.

In some embodiments, an inner edge of an upper surface of the first source/drain region may be between 0.3 and 0.7 microns from a lower edge of the inner sidewall of the first source/drain contact. In such embodiments, an outer edge of an upper surface of the first source/drain region may be less than 0.2 microns from the lower edge of an outer sidewall of the first source/drain contact.

In some embodiments, a location where the first source/drain region has a maximum depth may be closer to the lower edge of the inner sidewall of the first source/drain contact than it is to the lower edge of the outer sidewall of the first source/drain contact.

Pursuant to further embodiments of the present invention, RF transistor amplifiers are provided that include a semiconductor layer structure comprising a gallium nitride-based channel layer and a gallium nitride-based barrier layer that has a higher bandgap than the gallium nitride-based channel layer on an upper surface of the gallium nitride-based channel layer. First and second source/drain regions are formed in the semiconductor layer structure. A gate finger is provided on an upper surface of the semiconductor layer structure, the gate finger having a longitudinal axis that extends parallel to the upper surface of the semiconductor layer structure. A first source/drain contact is provided on the first source/drain region, the first source/drain contact having an inner sidewall that faces the gate finger and an outer sidewall opposite the inner sidewall. A second source/drain contact is provided on the second source/drain region, the second source/drain contact having an inner sidewall that faces the gate finger and an outer sidewall opposite the inner sidewall. An insulating layer is provided that directly contacts the semiconductor layer structure that includes a first portion that is between the first source/drain contact and the gate finger and a second portion that is between the second source/drain contact and the gate finger. A first area where the first portion of the insulating layer vertically overlaps the first source/drain region is greater than a second area where the second portion of the insulating layer vertically overlaps the second source/drain region.

In some embodiments, the first area is at least 50% or at least 100% greater than the second area.

In some embodiments, the first portion of the insulating layer may vertically overlap a location where the first source/drain region has a maximum depth.

In some embodiments, the first portion of the insulating layer may vertically overlap a location where the first source/drain region has a peak doping density.

In some embodiments, the first source/drain contact may be a drain contact, the first source/drain region may be a drain region, the second source/drain contact may be a source contact, and the second source/drain region may be a source region. In such embodiments, the RF transistor amplifier may further comprise a field plate that extends above an upper surface of the gate finger, the field plate being electrically connected to the source contact. The field plate may not vertically overlap the drain region.

DETAILED DESCRIPTION

Figure 1:
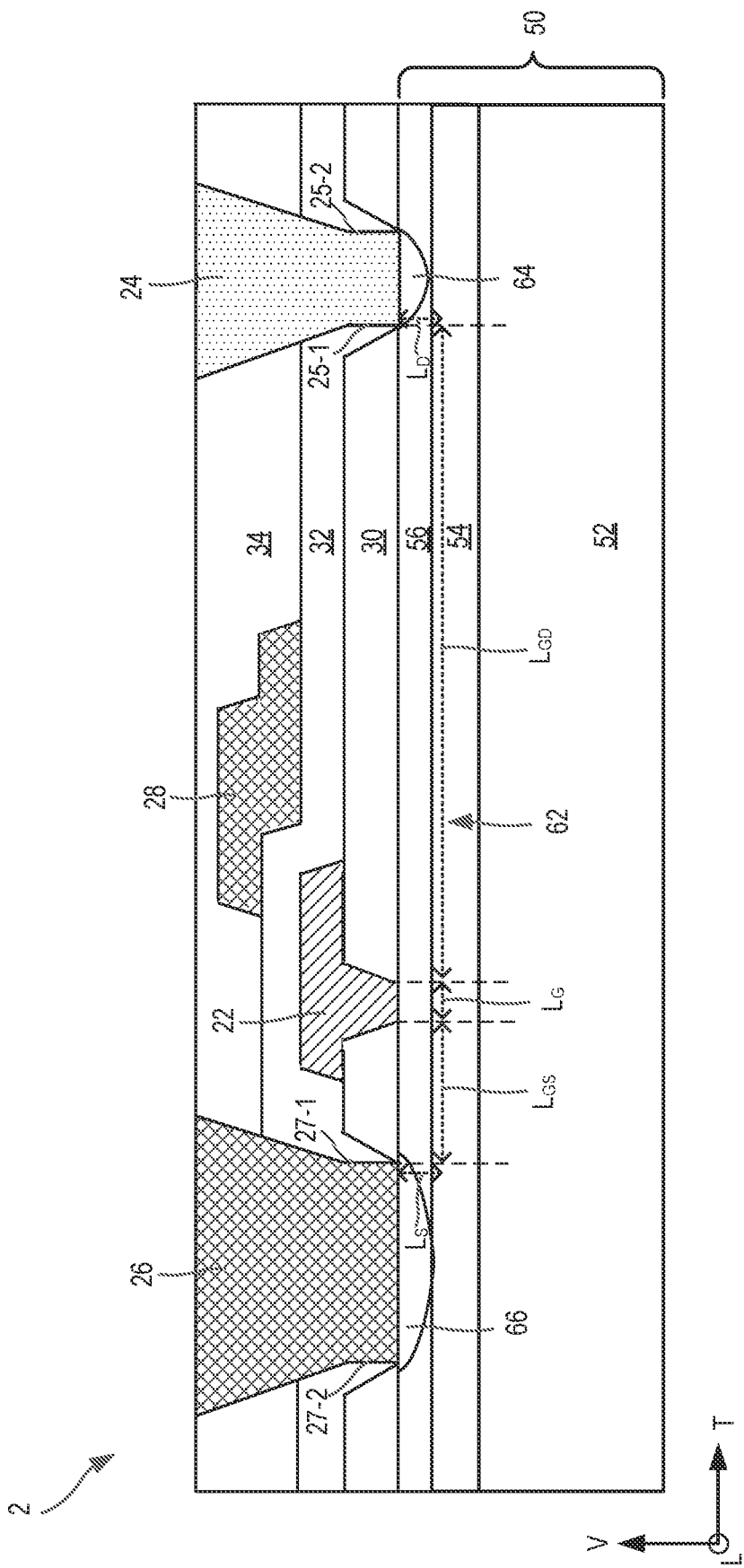
FIG. 1 is a schematic cross-sectional view of a unit cell of a conventional Group III nitride-based RF transistor amplifier.

Referring again to FIG. 1, the drain contact 24 has an inner sidewall 25-1 that faces the gate contact 22 and an outer sidewall 25-2 that faces a first adjacent unit cell (not shown). Similarly, the source contact 26 has an inner sidewall 27-1 that faces the gate contact 22 and an outer sidewall 27-2 that faces a second adjacent unit cell (not shown). As is also shown in FIG. 1, a conduction path between the source region 66 and the drain region 64 includes three primary regions (or segments when viewed in cross-section) and two additional regions/segments. The on-resistance for the unit cell transistor 2 may be defined as the resistance of these five regions/segments.

The three primary regions/segments are each located along the channel 62 that is formed at the junction between the channel layer 54 and the barrier layer 56. The first primary region/segment, which is labelled $L_{GS}$ in FIG. 1, refers to the portion of the channel that extends from underneath the lower edge of the inner sidewall 27-1 of the source contact 26 to underneath the lower edge of the sidewall of the gate contact 22 that faces the source contact 26. The second primary region/segment, which is labelled $L_G$ in FIG. 1, refers to the portion of the channel 62 that extends from underneath the lower edge of the sidewall of the gate contact 22 that faces the source contact 26 to underneath the lower edge of the sidewall of the gate contact 22 that faces the drain contact 24. The third primary region/segment, which is labelled $L_{GD}$ in FIG. 1, refers to the portion of the channel 62 that extends from underneath the lower edge of the sidewall of the gate contact 22 that faces the drain contact 24 to underneath the lower edge of the inner sidewall 25-1 of the drain contact 24.

The first additional region/segment, which is labelled $L_S$ in FIG. 1, refers to the vertical distance from the bottom of the source contact 26 to the junction between the channel layer 54 and the barrier layer 56. The second additional region/segment, which is labelled $L_D$ in FIG. 1, refers to the vertical distance from the bottom of the drain contact 24 to the junction between the channel layer 54 and the barrier layer 56. Typically, the portion of the barrier layer 56 between the source region 66 and the drain region 64 is doped more lightly than the source and drain regions 66, 64. Thus, the primary segments $L_{GS}$, $L_G$, $L_{GD}$ typically have a higher sheet resistance than the additional segments $L_S$, $L_D$, and the primary segments $L_{GS}$, $L_G$, $L_{GD}$ typically are significantly longer than the additional segments $L_S$, $L_D$. As such, the on-resistance may be primarily determined by the resistance of the three primary regions/segments $L_{GS}$, $L_G$, $L_{GD}$.

The on-resistance can be reduced by decreasing the size of the unit cell transistor 2 by, for example, reducing the lengths of segments $L_{GS}$ and/or $L_{GD}$. However, reducing the lengths of segments $L_{GS}$ and/or $L_{GD}$ acts to increase the intrinsic parasitic capacitances $C_{gd}$ and/or $C_{ds}$. In particular, the intrinsic gate-to-drain capacitance $C_{gd}$ is primarily a function of the capacitive coupling between the gate contact 22 and the drain contact 24. As such, reducing the length of segment $L_{GD}$ acts to increase both intrinsic parasitic capacitances $C_{gd}$ and $C_{ds}$. The intrinsic drain-to-source capacitance $C_{ds}$ is primarily a function of (1) the capacitive coupling between the drain contact 24 and the source contact 26 and (2) the capacitive coupling between the drain contact 24 and the field plate 28 (since the field plate 28 is electrically connected to the source contact 26). As such, reducing the length of segment $L_{GS}$ acts to increase the intrinsic parasitic capacitance $C_{ds}$. Thus, an inherent tradeoff exists in Group III nitride-based RF transistor amplifiers between the on-resistance and the parasitic intrinsic capacitances $C_{gd}$, $C_{ds}$. In particular, the on-resistance can be reduced by shrinking the size of the unit cells, but this results in an increase in the intrinsic parasitic capacitances $C_{gd}$, $C_{ds}$. The converse is also true, namely that the parasitic intrinsic capacitances $C_{gd}$, $C_{ds}$ can be reduced by increasing the size of each unit cell transistor, but this increases the on-resistance.

At very high frequencies (e.g., frequencies above 10 GHz), it may be difficult to impedance match the inner stages of multi-stage RF transistor amplifiers, particularly with respect to multi-stage RF transistor amplifiers that are implemented on a single die as a monolithic microwave integrated circuit or "MMIC" device. The difficulty in impedance matching the inner stages of these amplifiers may be due, at least in part, to the intrinsic parasitic capacitances within the individual RF transistor amplifier stages. Degraded impedance matching may lower the gain, drain efficiency and power added efficiency of the RF transistor amplifier.

Pursuant to embodiments of the present invention, Group III nitride-based RF transistor amplifiers are provided that may exhibit lower on-resistance values without any appreciable increase in the parasitic intrinsic capacitances $C_{gd}$ and $C_{ds}$. As noted above, the values of the parasitic intrinsic capacitances $C_{gd}$ and $C_{ds}$ are driven almost exclusively by the various capacitive couplings between the gate contact 22, the drain contact 24, the source contact 26 and the field plate 28, each of which is a large metal structure. Capacitive coupling between the drain region 64 and the gate contact 22, on the other hand, has almost no impact on $C_{gd}$, and capacitive coupling between the source region 66 and the gate contact 22 likewise has almost no impact on $C_{ds}$. Moreover, due to the higher doping levels of the drain and source regions 64, 66 as compared to the channel region 62 therebetween, the resistance of the drain and source regions 64, 66 may be significantly less than the resistance of the channel region 62. As such, the on-resistance can be reduced by widening the drain and/or source regions 64, 66 to extend closer to each other, since this effectively replaces portion(s) of the higher resistance channel region 62 with lower resistance drain and/or source region 64, 66. Moreover, since the capacitive coupling between the gate contact 22 and the drain and source regions 64, 66 is negligible (so long as the drain and source regions 64, 66 do not come very close to the gate contact 22), the reduction in on-resistance can be achieved without any appreciable increase in the parasitic intrinsic capacitances $C_{gd}$ or $C_{ds}$. In other words, replacing a portion of the channel region 62 with an extension of either the drain region 64 or the source region 66 lowers the on-resistance without changing the size of the unit cell 2 (i.e., without changing the relative locations of the gate contact 22, the drain contact 24, the source contact 26 and the field plate 28), and hence does not act to appreciably increase the intrinsic parasitic capacitances.

The Group III nitride-based RF transistor amplifiers according to some embodiments of the present invention may have asymmetrical drain regions that extend farther beyond a lower edge of the inner sidewall of the drain contact toward the source region than they extend beyond a lower edge of the of the outer sidewall of the drain contact away from the source region. These RF transistor amplifiers may additionally or alternatively have asymmetrical source regions that extend farther beyond a lower edge of the inner sidewall of the source contact toward the drain region than they extend beyond a lower edge of the outer sidewall of the source contact away from the drain region. In example embodiments, the magnitude of these asymmetries may be at least 25%, at least 50%, at least 100%, at least 200%, at least 300% or at least 400%. For example, the drain region may extend twice as far beyond a lower edge of the inner sidewall of the drain contact toward the source region than it extends beyond the lower edge of the outer sidewall of the drain contact away from the source region, resulting in an asymmetry of 100%.

The Group III nitride-based RF transistor amplifiers according to embodiments of the present invention may also have asymmetries with respect to how far the drain and source regions extend past the lower edges of the inner sidewalls of the respective drain and source contacts toward each other. For example, the drain region may extend farther beyond a lower edge of the inner sidewall of the drain contact toward the source region as compared to how far the source region extends beyond a lower edge of the inner sidewall of the source contact towards the drain region.

In some embodiments, the drain region may not extend sufficiently far beyond the lower edge of the inner sidewall of the drain contact toward the source region so that the field plate vertically overlaps the drain region.

The Group III nitride-based RF transistor amplifiers according to embodiments of the present invention may exhibit reduced on-resistance values and hence may exhibit higher drain currents during on-state operation. Moreover, this improvement in on-resistance may be achieved without an appreciable increase in either the gate-to-drain or drain-to-source parasitic intrinsic capacitances since the distances between the gate, drain and source contacts may not change. As such, the reduction in the on-resistance may be obtained without any appreciable reduction in the gain, drain efficiency or the power added efficiency of the RF transistor amplifier.

Pursuant to embodiments of the present invention, RF transistor amplifiers are provided that comprise a semiconductor layer structure comprising a gallium nitride-based channel layer and a gallium nitride-based barrier layer that has a higher bandgap than the gallium nitride-based channel layer on an upper surface of the gallium nitride-based channel layer. Spaced apart first and second source/drain regions are provided in the semiconductor layer structure. A gate finger is provided on an upper surface of the semiconductor layer structure, the gate finger having a longitudinal axis that extends parallel to the upper surface of the semiconductor layer structure. First and second source/drain regions extend in a longitudinal direction on an upper surface of the semiconductor layer structure. The first source/drain contact is on the first source/drain region, and has an inner sidewall that faces the gate finger and an outer sidewall opposite the inner sidewall, and the second source/drain contact is on the second source/drain region, and has an inner sidewall that faces the gate finger and an outer sidewall opposite the inner sidewall. The gate finger is positioned between the first source/drain contact and the second source/drain contact.

In some embodiments, the first source/drain region extends a first distance from a lower edge of the inner sidewall of the first source/drain contact towards the second source/drain region along a transverse axis that extends parallel to the plane defined by the upper surface of the semiconductor layer structure, and extends a second distance from a lower edge of the outer sidewall of the first source/drain contact away from the second source/drain region, where the first distance exceeds the second distance. The first distance may exceed the second distance by at least 25%, at least 50%, at least 100%, at least 200%, at least 300%, and at least 400% in various embodiments of the present invention.

In some embodiments, a first longitudinal axis that extends down a center of an upper surface of the first source/drain region is closer to a first sidewall of the gate finger than is a second longitudinal axis that extends down a center of a lower surface of the first source/drain contact.

In some embodiments, a center of an upper surface of the first source/drain region is offset from a center of a lower surface of the first source/drain contact in a transverse direction by a first amount, and a center of an upper surface of the second source/drain region is offset from a center of a lower surface of the second source/drain contact in the transverse direction by a second amount that is different from the first amount.

In some embodiments, a center of an upper surface of the second source/drain region is aligned with a center of a lower surface of the second source/drain contact in the transverse direction. In other embodiments, a center of an upper surface of the second source/drain region is offset from a center of a lower surface of the second source/drain contact in the transverse direction. A location where the first source/drain region has a maximum depth may be closer to the lower edge of the inner sidewall of the first source/drain contact than it is to the lower edge of the outer sidewall of the first source/drain contact.

In some embodiments, the first source/drain region is a drain region and the second source/drain region is a source region. In other embodiments, the first source/drain region is a source region and the second source/drain region is a drain region.

In some embodiments, a ratio of the first distance to a distance between the lower edge of the inner sidewall of the first source/drain contact and a lower edge of a sidewall portion of the gate finger that faces the first source/drain contact along the transverse axis is at least 0.1.

In some embodiments, the second source/drain region extends a third distance along the transverse axis from a lower edge of the inner sidewall of the second source/drain contact towards the first source/drain contact. The first distance may exceed the third distance by at least 25%, at least 50%, at least 100%, at least 200%, and at least 300% in various embodiments of the present invention.

In some embodiments, the first source/drain region has a first width along the transverse axis and the second source/drain region has a second width along the transverse axis, where the first width exceeds the second width.

In some embodiments, the first distance may be at least 0.3 microns. A location where the first source/drain region has a maximum depth may be closer to the lower edge of the inner sidewall of the first source/drain contact than it is to the lower edge of the outer sidewall of the first source/drain contact. A peak doping density of the first source/drain region may be closer to the lower edge of the inner sidewall of the first source/drain contact than it is to the lower edge of the outer sidewall of the first source/drain contact.

In some embodiment, the RF transistor amplifiers may include an insulating layer on an upper surface of the semiconductor layer structure. This insulating layer may directly contact the semiconductor layer structure and may include a first portion that is between the first source/drain contact and the gate finger and a second portion that is between the second source/drain contact and the gate finger. A first area where the first portion of the insulating layer vertically overlaps the first source/drain region may be greater than a second area where the second portion of the insulating layer vertically overlaps the second source/drain region. For example, the first area may be at least 50% or at least 100% greater than the second area. The first portion of the insulating layer may vertically overlap a location where the first source/drain region has a maximum depth and/or may vertically overlap a location where the first source/drain region has a peak doping density. Two elements are considered to "vertically overlap" if an axis that is perpendicular to a bottom surface of the semiconductor layer structure extends through both elements.

Embodiments of the present invention will be described in greater detail below with reference to FIGS. 2A-9B.

Figure 2A:
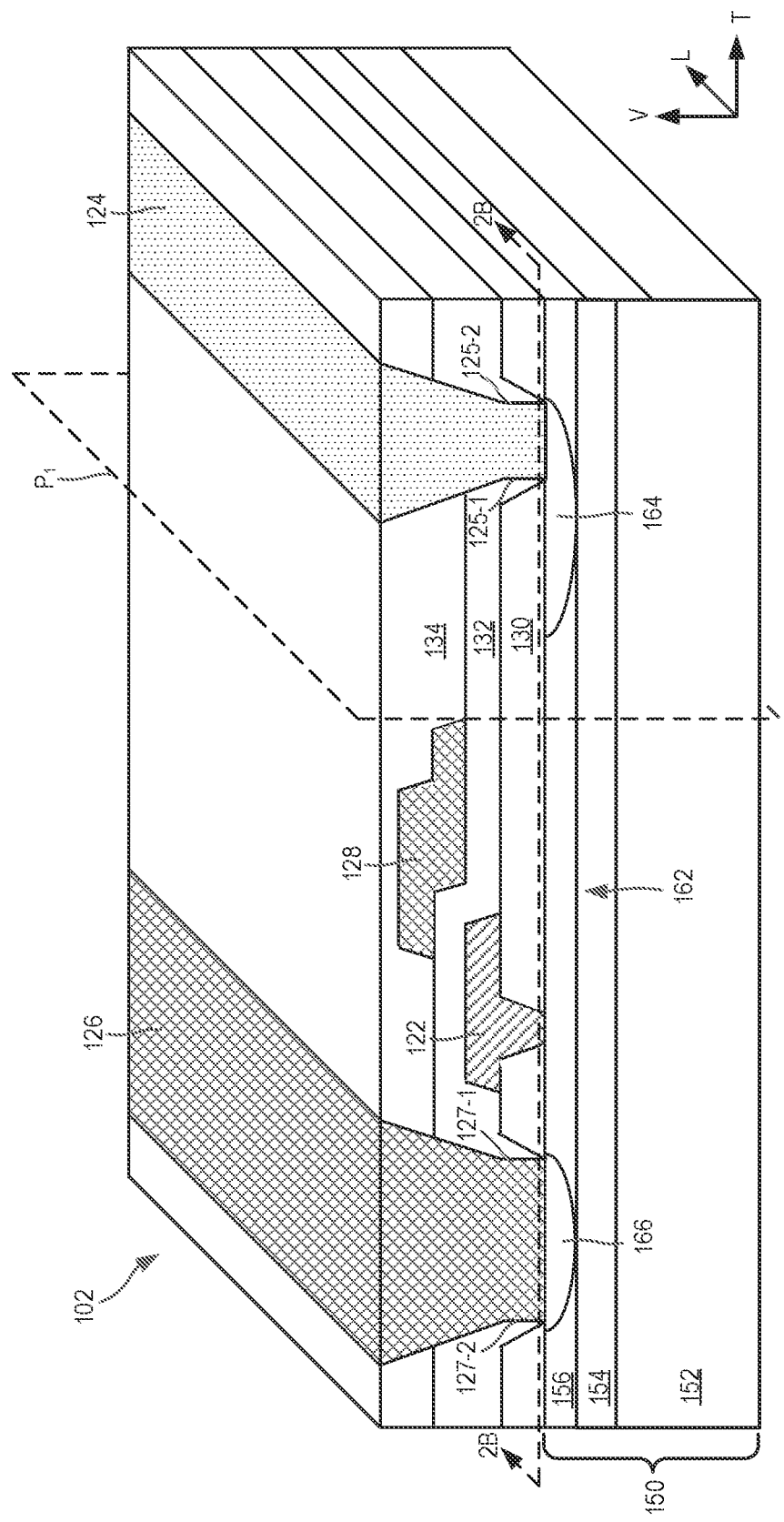
FIG. 2A is a schematic perspective view of a unit cell of a Group III nitride-based RF transistor amplifier die according to embodiments of the present invention.

FIG. 2A is a schematic perspective view of a unit cell 102 of a Group III nitride-based RF transistor amplifier according to embodiments of the present invention. As shown in FIG. 2A, the unit cell 102 includes a gate contact 122, a drain contact 124 and a source contact 126 that are each formed on an upper surface of a semiconductor layer structure 150. Longitudinal axes of the respective gate, drain and source contacts 122, 124, 126 extend in parallel to each other in the longitudinal direction L, with the gate contact 122 being positioned between the drain contact 124 and the source contact 126 along the transverse direction T. Herein, the gate contact 122 may also be referred to as a "gate finger" 122. Herein, the drain and source contacts 124, 126 may be referred to generically as "source/drain contacts." It will be understood that the term "source/drain contact" may refer to either a source contact or a drain contact. A first inter-metal insulation layer 130 electrically isolates the gate, drain and source contacts 122, 124, 126 from each other. A second inter-metal insulation layer 132 covers the gate contact 122, and a field plate 128 is formed on the second inter-metal insulation layer 132. The field plate 128 may be positioned above the semiconductor layer structure 150 in the region between the gate contact 122 and the drain contact 124, and may overlap the gate contact 122. The field plate 128 may be electrically connected to the source contact 126 by an electrical connection that is outside the cross-sectional view of FIG. 2A.

The semiconductor layer structure 150 includes a substrate 152 and a plurality of epitaxial layers that are grown on the substrate 152. The epitaxial layers include at least a channel layer 154 and a barrier layer 156. The barrier layer 156 may be a moderately doped n-type semiconductor layer (or multilayer structure). A heavily doped drain region 164 is formed underneath the drain contact 124, and a heavily doped source region 166 is formed underneath the source contact 126. The heavily doped drain region 164 and the heavily doped source region 166 may be formed in the barrier layer 156, and may optionally extend into the channel layer 154. The drain region 164 and the source region 166 may each have a maximum doping density of, for example, at least $1 \times 10^{19}$ dopants/cm$^3$. In some embodiments, the maximum doping density of the drain region 164 and the source region 166 may each be at least $3 \times 10^{19}$ dopants/cm$^3$, at least $5 \times 10^{19}$ dopants/cm$^3$ or at least $1 \times 10^{20}$ dopants/cm$^3$. The drain region 164 and the source region 166 may, for example, have a uniform doping density except at the periphery thereof. The edges of the drain region 164 and the source region 166 are the regions where the doping density has fallen to 2.5 orders of magnitude below the peak doping density. Herein, the drain and source regions 164, 166 may be referred to generically as a "source/drain region." It will be understood that the term "source/drain region" may refer to either a source region or a drain region.

When the gate, drain and source contacts 122, 124, 126 are connected to suitable direct current bias voltages and an RF signal is applied to the gate contact 122, a two dimensional electron gas (2DEG) is induced in the channel layer 154 at a junction between the channel layer 154 and the barrier layer 156. The 2DEG acts as a highly conductive channel 162 (also referred to herein as a "channel region 162") that allows conduction between the source region 166 and the drain region 164.

As can be seen by comparing FIGS. 1 and 2A, the unit cell 102 of FIG. 2A differs from the conventional unit cell 2 of FIG. 1 in that the drain region 164 extends significantly farther towards the source region 166 than drain region 64 extends towards the source region 66. Moreover, in some embodiments, only one side of the drain region 164 may be enlarged, namely the side that is closest to the corresponding source region 166 of the unit cell 102. As a result, the drain region 164 may be asymmetric with respect to the drain contact 124 when the unit cell 102 is viewed from above.

Figure 2B:
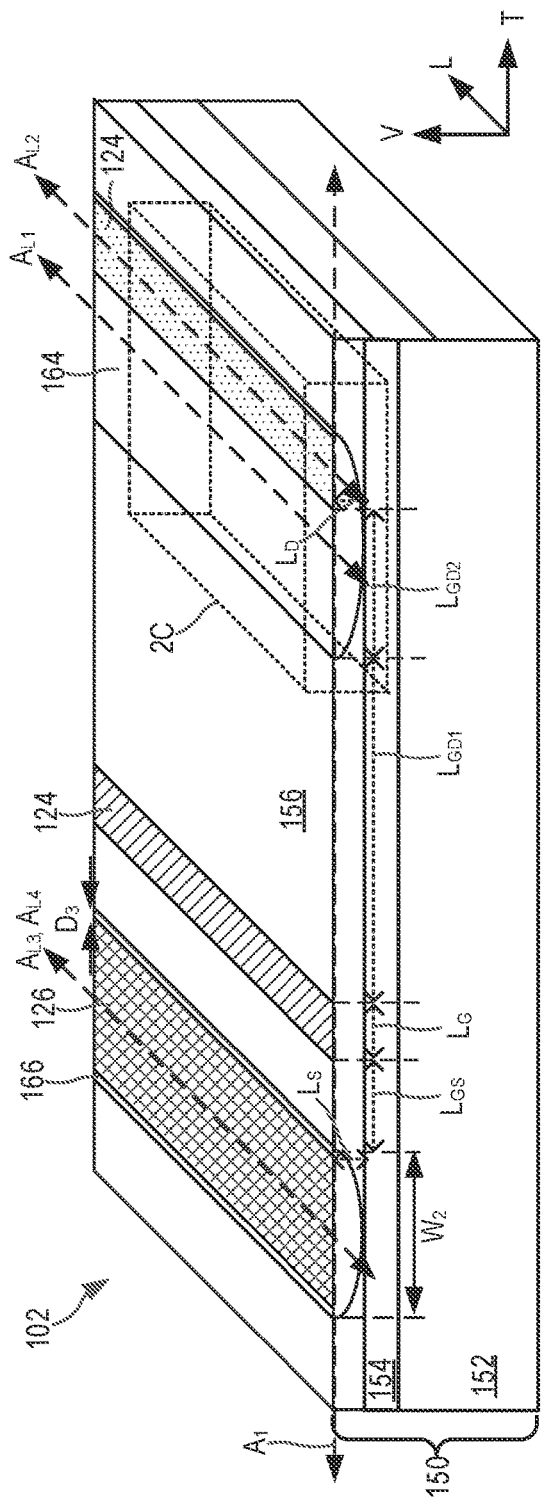
FIG. 2B is a schematic cross-sectional view taken along line 2B-2B of FIG. 2A.
Figure 2C:
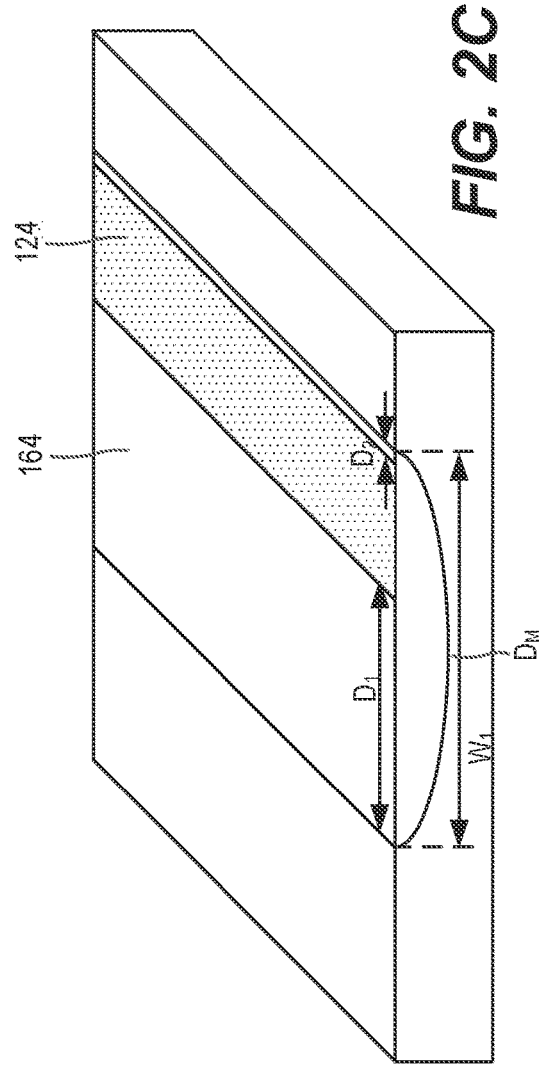
FIG. 2C is an enlarged view of the portion of FIG. 2B outlined in the dotted box labelled 2C in FIG. 2B.

FIG. 2B is a schematic cross-sectional view taken along line 2B-2B of FIG. 2A. The cross-section of FIG. 2B is taken along the plane defined by the top surface of the semiconductor layer structure 150. For clarity, the locations of the bottom surfaces of the gate, drain and source contacts 122, 124, 126 are shown in FIG. 2B even through these contacts are actually just above the cross-section of FIG. 2B. FIG. 2C is an enlarged view of the portion of FIG. 2B outlined in the dotted box labelled 2C in FIG. 2B.

As shown in FIG. 2B, the unit cell 102 of Group III nitride-based RF transistor amplifier 100 has a conduction path between the source region 166 and the drain region 164 over which carriers pass when appropriate bias voltages are applied to the device. This conduction path is shown in FIG. 2B and includes a total of six regions (or segments when viewed in cross-section), namely four primary regions/segments $L_{GS}$, $L_G$, $L_{GD1}$, $L_{GD2}$ and two additional regions/segments $L_S$, $L_D$. Regions/segments $L_{GS}$, $L_G$, $L_S$, and $L_D$ may be the same as the corresponding regions/segments of the conventional unit cell 2 described above with reference to FIG. 1, and hence further description thereof will be omitted. As is further shown in FIG. 2B, region/segment $L_{GD}$ of the conventional unit cell 2 is replaced in unit cell 102 with two regions/segments $L_{GD1}$, $L_{GD2}$. Region/segment $L_{GD1}$ generally corresponds to region/segment $L_{GD}$ of the conventional unit cell 2 except that region/segment $L_{GD1}$ is narrower than region/segment $L_{GD}$ of the conventional unit cell 2. Region/segment $L_{GD2}$ corresponds to the distance that the drain region 164 extends beyond a lower edge of the inner sidewall 125-1 of the drain contact 124. In a conventional device, this distance is typically very small (e.g., 0.1 microns or less) and hence is not separately labelled in the conventional unit cell 2 of FIG. 1). However, in the RF transistor amplifiers according to embodiments of the present invention, the distance $L_{GD2}$ is increased in order to decrease the on-resistance of the unit cell 102.

Referring to FIG. 2C, the drain region 164 in the unit cells 102 of the RF transistor amplifiers according to embodiments of the present invention extends a first distance $D_1$ past the lower edge of the inner sidewall 125-1 of the drain contact 124 toward the gate finger 122 when viewed from above (i.e., when viewed along an axis that is perpendicular to the upper surface of the semiconductor layer structure 150). In some embodiments, the first distance $D_1$ may be at least 0.25 microns, at least 0.3 microns, at least 0.4 microns, at least 0.5 microns or at least 0.6 microns. The drain region 164 may extend a second distance $D_2$ past the lower edge of the outer sidewall 125-2 of the drain contact 124 away from the gate finger 122 when viewed from above. In some embodiments, the second distance $D_2$ may be less than 0.2 microns, less than 0.1 microns, or less than 0.05 microns and, in some embodiments, the drain region 164 may not extend past the lower edge of the outer sidewall 125-2 of the drain contact 124. If the drain region 164 does not extend all the way to the lower edge of the outer sidewall 125-2 of the drain contact 124, it may be considered to extend a negative distance past the lower edge of the outer sidewall 125-2 of the drain contact 124 away from the gate finger 122 (i.e., distance $D_2$ is a negative number). In such embodiments, the first distance $D_1$ will exceed the second distance $D_2$ so long as the first distance $D_1$ is a positive number (i.e., so long as the drain region 164 extends past the lower edge of the inner sidewall 125-1 of the drain contact 124 toward the gate finger 122).

Generally speaking, the second distance $D_2$ does not significantly impact the performance of the device, as any portion of the drain region 164 that extends beyond the lower edge of the outer sidewall 125-2 of the drain contact 124 will not be part of the conductive path during device operation. Conventionally, the second distance $D_2$ is kept small (e.g., 0.1 microns or less) in order to improve the breakdown performance of the device and/or to allow for increased device integration (i.e., packing the unit cells 102 more closely together).

As can be seen in FIG. 2B, the first distance $D_1$ may be significantly larger than the second distance $D_2$. As the first distance $D_1$ is made larger than the corresponding first distance of conventional devices, the on-resistance of the RF transistor amplifiers according to embodiments of the present invention may be lower than the on-resistance of conventional RF transistor amplifiers. However, if the first distance $D_1$ is increased too much (i.e., the drain region 164 starts to get too close to the gate contact 122), then the breakdown voltage of the RF transistor amplifier 100 may start to appreciably decrease. Thus, in some embodiments the first distance $D_1$ may be, for example, between 0.25 microns and 0.8 microns in some embodiments, between 0.3 and 0.7 microns in other embodiments, between 0.4 and 0.6 microns in other embodiments, and between 0.3 and 0.5 microns in still further embodiments. In example embodiments, the drain region 164 extends at least 25% farther past the lower edge of the inner sidewall 125-1 of the drain contact 124 (i.e., the sidewall that faces the source contact 126 of the unit cell 102) than the drain region 164 extends past the lower edge of the outer sidewall 125-2 of the drain contact 124. In other embodiments, the drain region 164 may extend at least 50%, at least 100%, at least 200%, at least 300% or at least 400% farther past the lower edge of the inner sidewall 125-1 of the drain contact 124 than the drain region 164 extends past the lower edge of the outer sidewall 125-2 of the drain contact 124.

As shown in FIG. 2B, the source region 166 extends a third distance $D_3$ past the lower edge of the inner sidewall 127-1 of the source contact 126 toward the gate finger 122 when viewed from above (i.e., when viewed along an axis that is perpendicular to the upper surface of the semiconductor layer structure 150). The first distance $D_1$ may exceed the third distance $D_3$ by at least 100%, at least 200%, at least 300%, or at least 400% in example embodiments.

As shown in FIG. 2B, a transverse axis $A_1$ extends along the upper surface of the semiconductor layer structure 150. The gate contact 122, the drain contact 124 and the source contact 126 each extend in a longitudinal direction (direction L) on the upper surface of the semiconductor layer structure 150. The transverse axis $A_1$ extends in the transverse direction T perpendicular to the longitudinal axes of the gate, drain and source contacts 122, 124, 126. The first distance $D_1$ comprises a distance along the transverse axis $A_1$. The second distance $D_2$ likewise comprises a distance along the transverse axis $A_1$.

As shown in FIG. 2C, the drain region 164 has a maximum width (which typically occurs at or just below the upper surface of the semiconductor layer structure 150) $W_1$. As shown in FIG. 2B, the source region 166 has a maximum width (which also typically occurs at or just below the upper surface of the semiconductor layer structure 150) $W_2$. The maximum width $W_1$ of the drain region 164 exceeds the maximum width $W_2$ of the source region 166.

The sum of the distances $L_{GD1}$ and $L_{GD2}$ may, in some embodiments, be between 2.0 and 5.0 microns, and between 3.0 and 4.0 microns in other embodiments. In some embodiments, the ratio of $L_{GD2}/L_{GD1}$ may be at least 0.1. In other embodiments, the ratio of $L_{GD2}/L_{GD1}$ may be at least 0.13, or at least 0.15, or at least 0.17.

As shown in FIG. 2C, the drain region 164 may have a maximum depth $D_M$ in the vertical direction V that is approximately in the middle of the drain region 164 in the transverse direction T. The location where the drain region 164 reaches the maximum depth $D_M$ may be closer to the lower edge of the inner sidewall 125-1 of the drain contact 124 than it is to the lower edge of the outer sidewall 125-2 of the drain contact 124. This location may vertically overlap the first inter-metal insulation layer 130. In contrast, the location where the drain region 64 of the conventional unit cell reaches its maximum depth vertically overlaps the bottom surface of the drain contact 24 and is not underneath the first inter-metal insulation layer 30.

The location of the peak doping density of the drain region 164 may be closer to the lower edge of the inner sidewall 125-1 of the first drain contact 124 than it is to the lower edge of the outer sidewall 125-2 of the drain contact 124.

A first longitudinal axis $A_{L1}$ that extends down a center of an upper surface of the drain region 164 is closer to a lower edge of a facing sidewall of the gate finger 122 than is a second longitudinal axis $A_{L2}$ that extends down a center of a lower surface of the drain contact 124. In contrast, a third longitudinal axis $A_{L3}$ that extends down a center of an upper surface of the source region 166 is at a same distance to a lower edge of a facing sidewall of the gate finger 122 as is a fourth longitudinal axis $A_{L4}$ that extends down a center of a lower surface of the source contact 126.

Referring again to FIG. 2A, the first inter-metal insulation layer 130 is formed directly on a top surface of the semiconductor layer structure 150. The first inter-metal insulation layer 130 includes a first portion that is between the drain contact 124 and the gate finger 122 and a second portion that is between the source contact 126 and the gate finger 122. A first area where the first portion of the first inter-metal insulating layer 130 vertically overlaps the drain region 164 is greater than a second area where the second portion of the first inter-metal insulating layer 130 vertically overlaps the source region 166. The first area may at least 50% greater than the second area, but typically will be much larger than the second area (e.g., two, five or even ten times larger). The first portion of the first inter-metal insulation layer 130 may vertically overlap a location where the drain region 164 has a maximum depth and/or a location where the drain region 164 has a peak doping density.

As discussed above, any appreciable increase in the drain-to-source parasitic capacitance $C_{ds}$ may negatively impact the performance of the RF transistor amplifier 100. While the drain contact 124 and the source contact 126 are spaced far apart, and hence do not tend to appreciable capacitively couple with each other, the field plate 128 is electrically connected to the source and hence any coupling between the drain contact 124 and the field plate 128 contributes to $C_{ds}$. While the drain region 164 is at a different level in the device structure than the field plate 128, capacitive coupling can occur between the drain region 164 and the field plate 128, particularly if the field plate 128 vertically overlaps the drain region 164. Thus, in some embodiments of the present invention, the drain region 164 extends a distance along the transverse axis $A_1$ that is less than the distance along the transverse axis $A_1$ from the lower edge of the inner sidewall 125-1 of the drain contact 124 to a first longitudinally-extending plane $P_1$ that extends perpendicular to the upper surface of the semiconductor layer structure 150 and that contacts the edge of the field plate 128 that is closest to the drain region 164. The first longitudinally-extending plane $P_1$ is shown graphically in FIG. 2A. This ensures that the field plate 128 does not vertically overlap the drain region 164, and hence helps ensure that the intrinsic parasitic capacitance Cas is not appreciably increased by the widening of the drain region 164.

The widened drain region 164 may be formed using conventional fabrication techniques, except that an ion implant mask that is used to perform the ion implantation step that forms the drain region 64 of a conventional device may be widened in order to form the widened drain region 164. In the unit cell of 2 of the conventional RF transistor amplifier, the ion implantation mask may have an opening that has a width that is substantially equal to a width of the bottom surface of the drain contact 24. As a result, the drain region 64 has a width that is only slightly larger than the width of the lower surface of the drain contact 24, and the maximum doping density of the drain region 64 is underneath the center of the lower surface of the drain contact 24 (in the transverse direction T). In contrast, the ion implantation mask used to form the unit cell 102 of RF transistor amplifier 100 has an opening that may, for example, extend closer to the gate contact 122, such that the center of the drain region 164 is underneath the inter-metal insulation layer 130 as opposed to being underneath the lower surface of the drain contact 124.

The use of source/drain regions that extend beyond the lower edge of the inner sidewalls of source/drain contacts is known in the art. In particular, MOSFETs having ultra-short channel regions routinely are formed to have both a regular drain region underneath the drain contact and to have so-called "lightly-doped drain region" that extends inwardly from the regular drain region toward the gate contact. These lightly-doped drain regions typically (1) are doped more lightly than the regular drain regions and (2) have a shallower depth than the regular drain regions. The provision of the lightly-doped drain region lowers the electric field in the channel in the vicinity of the regular drain region, which may reduce hot carrier injection effects where carriers gain sufficient kinetic energy that they may be injected into the gate dielectric layer of the MOSFET where the carriers may degrade the gate dielectric layer, which may lead to adverse effects such as increased leakage currents and/or premature breakdown of the gate dielectric layer. In such devices, a lightly-doped source region is also typically provided in order to simply manufacturing.

The widened source/drain regions included in the RF transistor amplifiers according to embodiments of the present invention may be provided for a completely different purpose, namely to reduce the on-resistance of the RF transistor amplifier without appreciably increasing the parasitic intrinsic capacitances of the device. Additionally, the widened source/drain regions included in the RF transistor amplifiers according to embodiments of the present invention may have a different shape as compared to the lightly-doped drain regions used in conventional MOSFETs (which are shallower than the regular drain regions), and may have a different doping density as compared to the lightly-doped drain regions used in conventional MOSFETs (namely the widened drain regions disclosed herein may have higher doping densities and may have generally uniform doping densities both underneath the lower surface of the drain contact and underneath the inter-metal insulation layer).

Figure 3A:
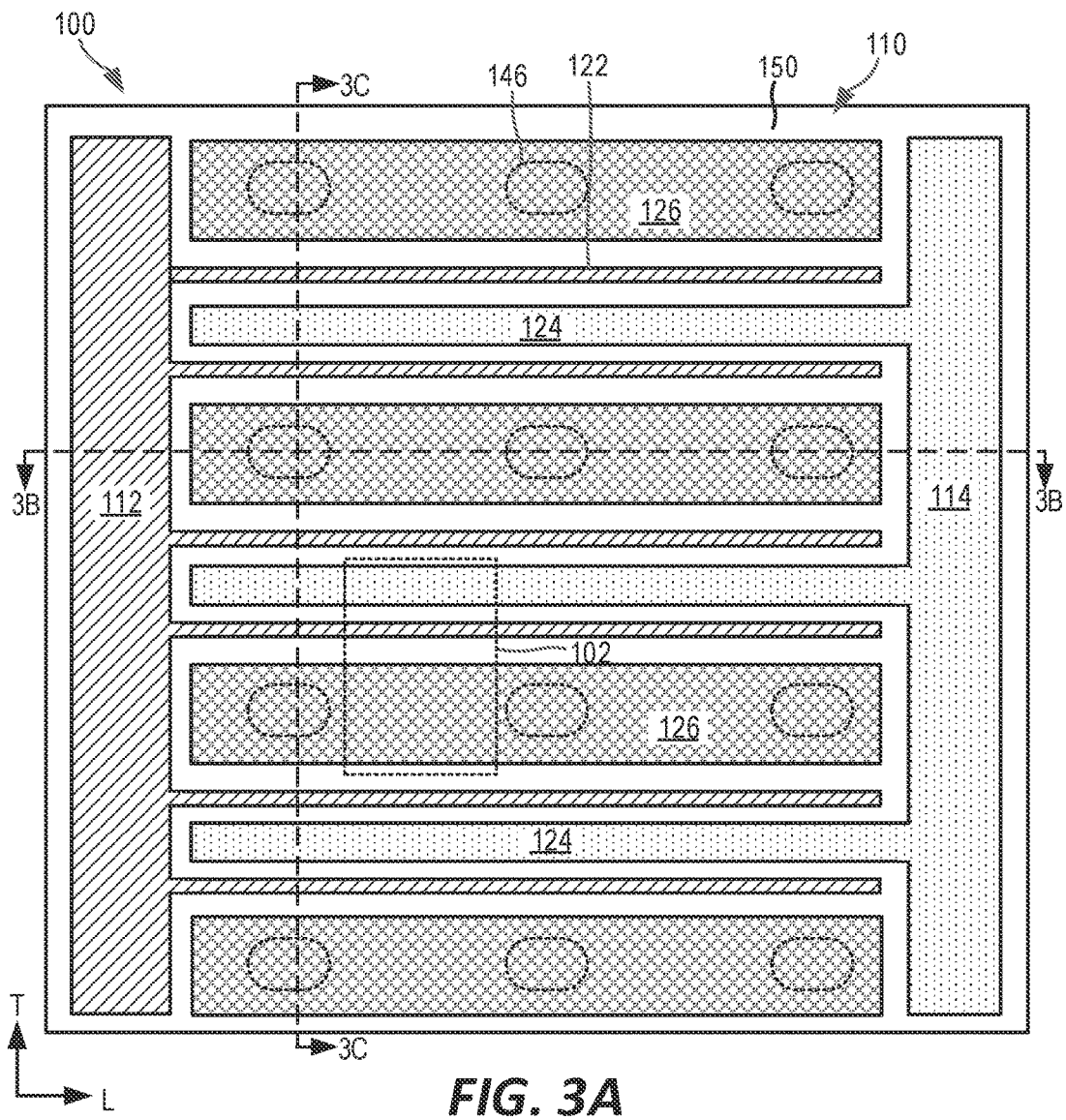
FIG. 3A is a schematic plan view of a Group III nitride-based RF transistor amplifier die according to embodiments of the present invention that includes unit cells having the design of FIGS. 2A-2B. The view of FIG. 3A is taken just above the top surface of the semiconductor layer structure to illustrate the lowest level of the contact metallization.
Figure 3B:
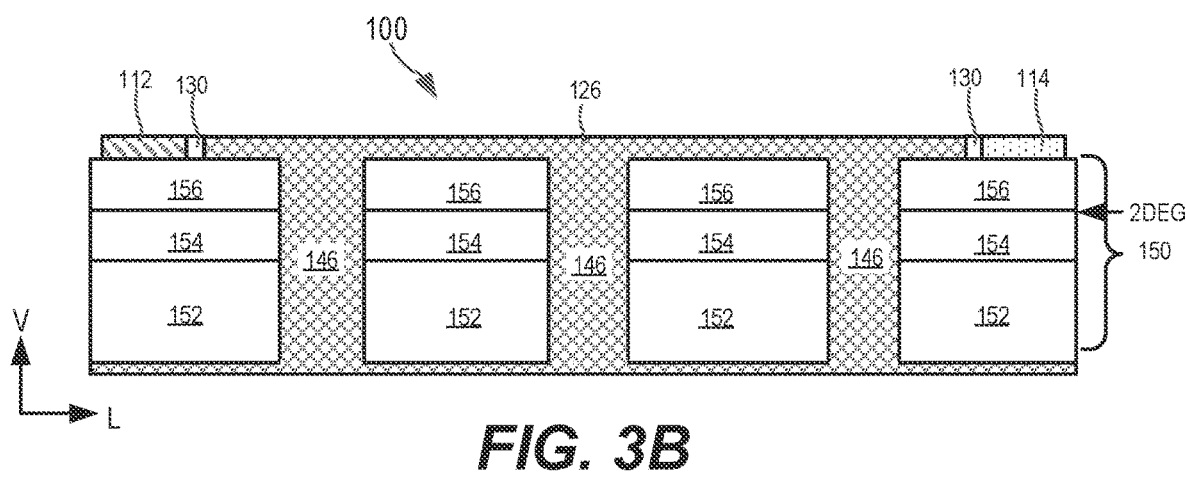
FIG. 3B is a schematic cross-sectional view taken along line 3B-3B of FIG. 3A.
Figure 3C:
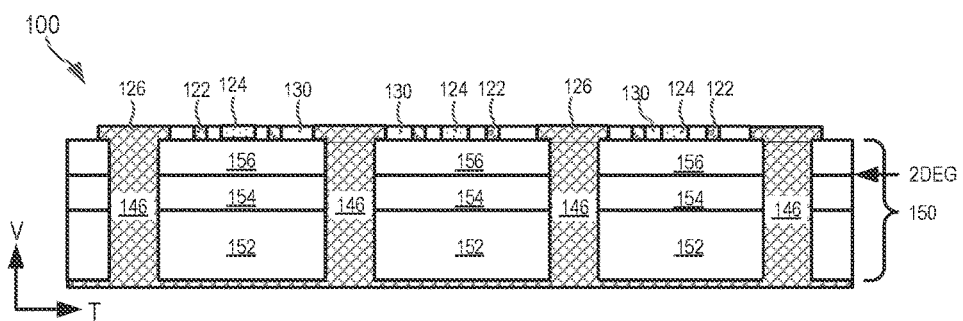
FIG. 3C is a schematic cross-sectional view taken along line 3C-3C of FIG. 3A.

FIGS. 3A through 3C are various views that schematically illustrate the Group III nitride-based RF transistor amplifier die 100 that includes the unit cell 102 discussed above with reference to FIG. 2. In particular, FIG. 3A is a schematic plan view of the RF transistor amplifier die 100. In FIG. 3A, only the lowermost portion of the metallization formed on the upper surface of the semiconductor layer structure 150 is shown. FIG. 3B are 3C are schematic cross-sectional views of the RF transistor amplifier die 100 taken along lines 3B-3B and 3C-3C of FIG. 3A, respectively. It will be appreciated that FIGS. 3A-3C (and many of the other figures of the present application) are highly simplified diagrams, and that actual RF transistor amplifiers may include many more unit cells and various circuitry and elements that are not shown in the simplified figures herein.

As shown in FIG. 3A, the RF transistor amplifier die 100 includes a top side metallization structure 110 that is formed on a semiconductor layer structure 150. The top side metallization structure 110 includes a gate bus 112 and a drain bus 114, a plurality of gate fingers 122, a plurality of drain contacts 124 and a plurality of source contacts 126, all of which are formed on an upper surface of the semiconductor layer structure 150. The gate fingers 122, drain contacts 124 and source contacts 126 may extend in parallel to each other, with the gate fingers 122 extending from the gate bus 112 in a first direction and the drain contacts 124 extending from the drain bus 114 in a direction opposite the first direction. Each gate finger 122 may be positioned between a drain contact 124 and a source contact 126.

The gate bus 112 and the gate fingers 122 may be implemented as a first monolithic metal pattern. The gate fingers 122 may be formed of materials that are capable of making a Schottky contact to a Group III nitride-based semiconductor material, such as Ni, Pt, Cu, Pd, Cr, W and/or WSiN. The gate bus 112 and the gate fingers 122 are part of a gate electrode structure of the RF transistor amplifier die 100. The upper portion (not shown) of the gate electrode may act as the gate terminal of the RF transistor amplifier die 100. A first circuit element (not shown) may be connected to the gate terminal by, for example, bond wires (not shown). The first circuit element may pass an input RF signal that is to be amplified to the RF transistor amplifier die 100.

The drain bus 114 and the drain contacts 124 may be implemented as a second monolithic metal pattern. The drain contacts 124 may include a metal, such as TiAlN, that can form an ohmic contact to Group III nitride-based materials. The drain bus 114 and the drain contacts 124 are part of a drain electrode of the RF transistor amplifier die 100. The upper portion (not shown) of the drain electrode may act as a drain terminal of the RF transistor amplifier die 100. A second circuit element (not shown) may be connected to the drain terminal by, for example, bond wires (not shown). The second circuit element may receive an amplified RF signal that is output by the RF transistor amplifier die 100. The gate and drain terminals are not shown in FIG. 3A.

The source contacts 126 may include a metal, such as TiAlN, that can form an ohmic contact to Group III nitride-based materials. The source contacts 126 are physically and electrically connected to a source terminal (not shown) of the RF transistor amplifier die 100 that may be located on the bottom side of the semiconductor layer structure 150 by a plurality of metal-plated source vias 146. Each metal-plated source via 146 may extend from the top metallization structure 110 through the semiconductor layer structure 150. Each metal-plated source via 146 may each be implemented by forming openings though the semiconductor layer structure 150 (e.g., by anisotropic etching) and by then depositing metal-plating that coats the sidewalls of the openings. In some applications, the metal may completely fill the openings so that the metal-plated vias are metal-filled vias. However, in many applications, the RF transistor amplifier die 100 may operate over a wide temperature range (due to outdoor applications and/or the high levels of heat that may be generated within the RF transistor amplifier die 100 during device operation), which may lead to high stress levels in the device due to the metal and semiconductor materials having significantly different coefficients of thermal expansion. In such cases, the center of the metal-plated source vias 146 may be left open (i.e., air-filled) in order to reduce the amount of stress that occurs due to thermal cycling. It will also be appreciated that in some cases the source terminal may be formed on the upper surface of the semiconductor layer structure 150, in which case the vias 146 may be omitted.

As described above with reference to FIGS. 2A-2B, various inter-metal insulating layers and/or passivation layers 130, 132, 134 may be formed that isolate the gate metallization 112, 122, the drain metallization 114, 124 and the source metallization 126 from each other. The inter-metal insulating layers and/or passivation layers 130, 132, 134 may include a dielectric material, such as SiN, $SiO_2$, etc.

The RF transistor amplifier die 100 includes a plurality of unit cell transistors 102, one of which was discussed above with reference to FIGS. 2A-2C. The location of the unit cell 102 of FIGS. 2A-2C is indicated in the dashed box in FIG. 3A. The unit cell transistor 102 includes a gate finger 122, a portion of a drain contact 124 and a portion of a source contact 126 along with the portions of the semiconductor layer structure 150 underlying the identified gate finger 122, drain contact 124 and source contact 126. Since all of the gate fingers 122 are electrically connected to a common gate bus 112, all of the drain contacts 124 are electrically connected to a common drain bus 114, and all of the source contacts 126 are electrically connected to a common source terminal, it can be seen that the unit cell transistors 102 are all electrically connected together in parallel.

The RF transistor amplifier die 100 may comprise a Group III nitride-based HEMT RF transistor amplifier. Suitable structures for Group III-nitride-based HEMT devices that may utilize embodiments of the present invention are described, for example, in commonly assigned U.S. Patent Publication No. 2002/0066908A1 published Jun. 6, 2002, for "Aluminum Gallium Nitride/Gallium Nitride High Electron Mobility Transistors Having A Gate Contact On A Gallium Nitride-based Cap Segment And Methods Of Fabricating Same," U.S. Patent Publication No. 2002/0167023A1 for "Group-III Nitride-based High Electron Mobility Transistor (HEMT) With Barrier/Spacer Layer," published Nov. 14, 2002, U.S. Patent Publication No. 2004/0061129 for "Nitride-Based Transistors And Methods Of Fabrication Thereof Using Non-Etched Contact Recesses," published on Apr. 1, 2004, U.S. Pat. No. 7,906,799 for "Nitride-Based Transistors With A Protective Layer And A Low-Damage Recess" issued Mar. 15, 2011, and U.S. Pat. No. 6,316,793 entitled "Nitride-Based Transistors On Semi-Insulating Silicon Carbide Substrates," issued Nov. 13, 2001, the disclosures of which are hereby incorporated herein by reference in their entirety.

FIGS. 3B and 3C illustrate the semiconductor layer structure 150 in more detail. As shown in FIGS. 3B and 3C, the semiconductor layer structure 150 includes a plurality of semiconductor layers. In the depicted embodiment, a total of two semiconductor layers are shown, namely a channel layer 154 and a barrier layer 156 that is on a top side of the channel layer 154. The semiconductor layer structure 150 may (and typically will) include additional semiconductor and/or non-semiconductor layers. For example, the semiconductor layer structure 150 may include a growth substrate 152 on which the other semiconductor layers are grown. The growth substrate 152 may comprise, for example, a 4H-SiC or 6H-SiC substrate. In other embodiments, the growth substrate 152 may be comprise a different semiconductor material (e.g., silicon or a Group III nitride-based material, GaAs, ZnO, InP) or a non-semiconductor material (e.g., sapphire). The growth substrate 152, even if formed of a non-semiconductor material, is considered to be part of the semiconductor layer structure 150.

Optional buffer, nucleation and/or transition layers (not shown) may be provided on the growth substrate 152 beneath the channel layer 154. For example, an AlN buffer layer may be included to provide an appropriate crystal structure transition between a SiC growth substrate 152 and the remainder of the semiconductor layer structure 150. Additionally, strain balancing transition layer(s) may also be provided as described, for example, in commonly assigned U.S. Patent Publication 2003/0102482A1, published Jun. 5, 2003, and entitled "Strain Balanced Nitride Heterojunction Transistors And Methods Of Fabricating Strain Balanced Nitride Heterojunction Transistors," the disclosure of which is incorporated herein by reference as if set forth fully herein.

In some embodiments, the channel layer 154 is a Group III nitride material, such as $Al_xGa_{-x}N$ where $0 \leq x < 1$, provided that the energy of the conduction band edge of the channel layer 154 is less than the energy of the conduction band edge of the barrier layer 156 at the interface between the channel and barrier layers 154, 156. In certain embodiments of the present invention, x=0, indicating that the channel layer 154 is gallium nitride ("GaN"). The channel layer 154 may also be other Group III nitrides such as InGaN, AlInGaN or the like. The channel layer 154 may be undoped or unintentionally doped and may be grown to a thickness of, for example, greater than about 20 Å. The channel layer 154 may also be a multi-layer structure, such as a superlattice or combinations of GaN, AlGaN or the like.

The channel layer 154 may have a bandgap that is less than the bandgap of at least a portion of the barrier layer 156, and the channel layer 154 may also have a larger electron affinity than the barrier layer 156. In certain embodiments, the barrier layer 156 is AN, AlInN, AlGaN or AlInGaN with a thickness of between about 0.1 nm and about 10 nm or more. In particular embodiments, the barrier layer 156 is thick enough and has a high enough Al composition and doping to induce a significant carrier concentration at the interface between the channel layer 154 and the barrier layer 156.

The barrier layer 156 may be a Group III nitride and may have a bandgap larger than that of the channel layer 154 and a smaller electron affinity than the channel layer 154. Accordingly, in certain embodiments of the present invention, the barrier layer 156 may include AlGaN, AlInGaN and/or AlN or combinations of layers thereof. The barrier layer 156 may, for example, be from about 0.1 nm to about 30 nm thick. In certain embodiments, the barrier layer 156 is undoped or doped with an n-type dopant to a concentration less than about $10^{19}$ cm$^{-3}$. In some embodiments of the present invention, the barrier layer 156 is Al$_x$Ga$_{1-x}$N where 0<x<1. In particular embodiments, the aluminum concentration is about 25%. However, in other embodiments of the present invention, the barrier layer 156 comprises AlGaN with an aluminum concentration of between about 5% and about 100%. In specific embodiments of the present invention, the aluminum concentration is greater than about 10%.

Due to the difference in bandgap between the barrier layer 156 and the channel layer 154 and piezoelectric effects at the interface between the barrier layer 156 and the channel layer 154, a two-dimensional electron gas (2DEG) is induced in the channel layer 154 at a junction between the channel layer 154 and the barrier layer 156. The 2DEG acts as a highly conductive layer that allows conduction between the source region of each unit cell transistor 102 and its associated drain region.

Figure 4:
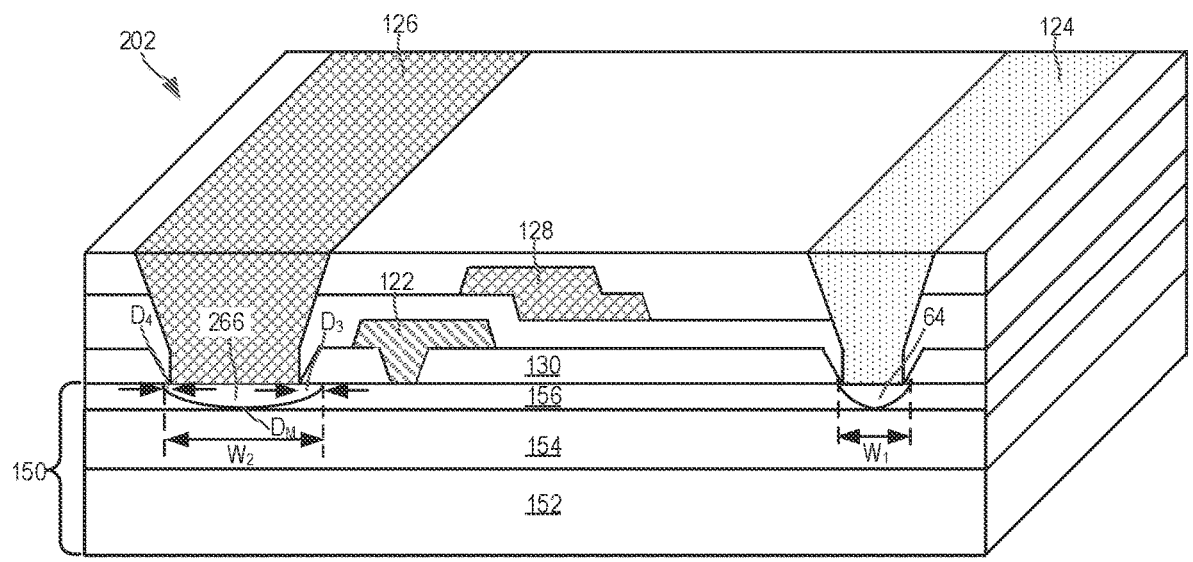
FIG. 4 is a schematic perspective view of a unit cell of a Group III nitride-based RF transistor amplifier die according to further embodiments of the present invention.

FIG. 4 is a schematic perspective view of a unit cell 202 of a Group III nitride-based RF transistor amplifier die according to further embodiments of the present invention. The unit cell 202 is very similar to the unit cell 102 of FIGS. 2A-2C, except that the unit cell 202 has (1) a drain region 64 having the conventional design of unit cell 2 (FIG. 1) and (2) a widened source region 266. The discussion below will focus on the differences between unit cell 202 and unit cell 102.

As shown in FIG. 4, the source region 266 extends a third distance D$_3$ past the lower edge of the inner sidewall 127-1 of the source contact 126 toward the gate finger 122 when viewed from above. In some embodiments, the third distance D$_3$ may be at least 0.25 microns, at least 0.3 microns or at least 0.4 microns. The source region 266 may extend a fourth distance D$_4$ past the lower edge of the outer sidewall 127-2 of the source contact 126 away from the gate finger 122 when viewed from above. In some embodiments, the fourth distance D$_4$ may be less than 0.2 microns, less than 0.1 microns, or less than 0.05 microns and, in some embodiments, the source region 266 may not extend past the lower edge of the outer sidewall 127-2 of the source contact 126. Generally speaking, the fourth distance D$_4$ does not significantly impact the performance of the device, as any portion of the source region 266 that extends beyond the lower edge of the outer sidewall 127-2 of the source contact 126 will not be part of the conductive path during device operation. Conventionally, the fourth distance D$_4$ is kept small (e.g., 0.1 microns or less).

As is also shown in FIG. 4, the third distance D$_3$ may exceed the fourth distance D$_4$. As the third distance D$_3$ is made larger than the corresponding third distance of the conventional unit cell 2 of FIG. 1, the on-resistance of the unit cell 202 may be reduced. However, if the third distance D$_3$ is increased too much (i.e., the source region 266 starts to get too close to the gate contact 122), then the breakdown voltage of the device may start to appreciably decrease. Thus, in some embodiments the third distance D$_3$ may be, for example, between 0.25 microns and 0.5 microns in some embodiments, between 0.3 and 0.5 microns in other embodiments. In example embodiments, the source region 266 extends at least 25%, at least 50%, at least 100%, or at least 200%, farther past the lower edge of the inner sidewall 127-1 of the source contact 126 than the source region 266 extends past the lower edge of the outer sidewall 127-2 of the source contact 126.

As is also shown in FIG. 4, the drain region 64 extends a first distance D$_1$ past the lower edge of the inner sidewall 125-1 of the drain contact 124 toward the gate finger 122 when viewed from above. The third distance D$_3$ may exceed the first distance D$_1$ by at least 50%, at least 100%, or at least 200% in example embodiments.

The source region 266 has a maximum width W$_2$ while the drain region 64 has a maximum width W$_1$. The maximum width W$_2$ of the source region 266 exceeds the maximum width W$_1$ of the drain region 64. The location of the peak doping density of the source region 266 may be closer to the lower edge of the inner sidewall 127-1 of the source contact 124 than it is to the lower edge of the outer sidewall 127-2 of the source contact 126.

The source region 266 may have a maximum depth D$_M$ in the vertical direction V that is approximately in the middle of the source region 266 the transverse direction T. The location where the source region 266 reaches the maximum depth DM may be closer to the lower edge of the inner sidewall 127-1 of the source contact 126 than it is to the lower edge of the outer sidewall 127-2 of the source contact 126. This location may vertically overlap the first inter-metal insulation layer 130.

Figure 5:
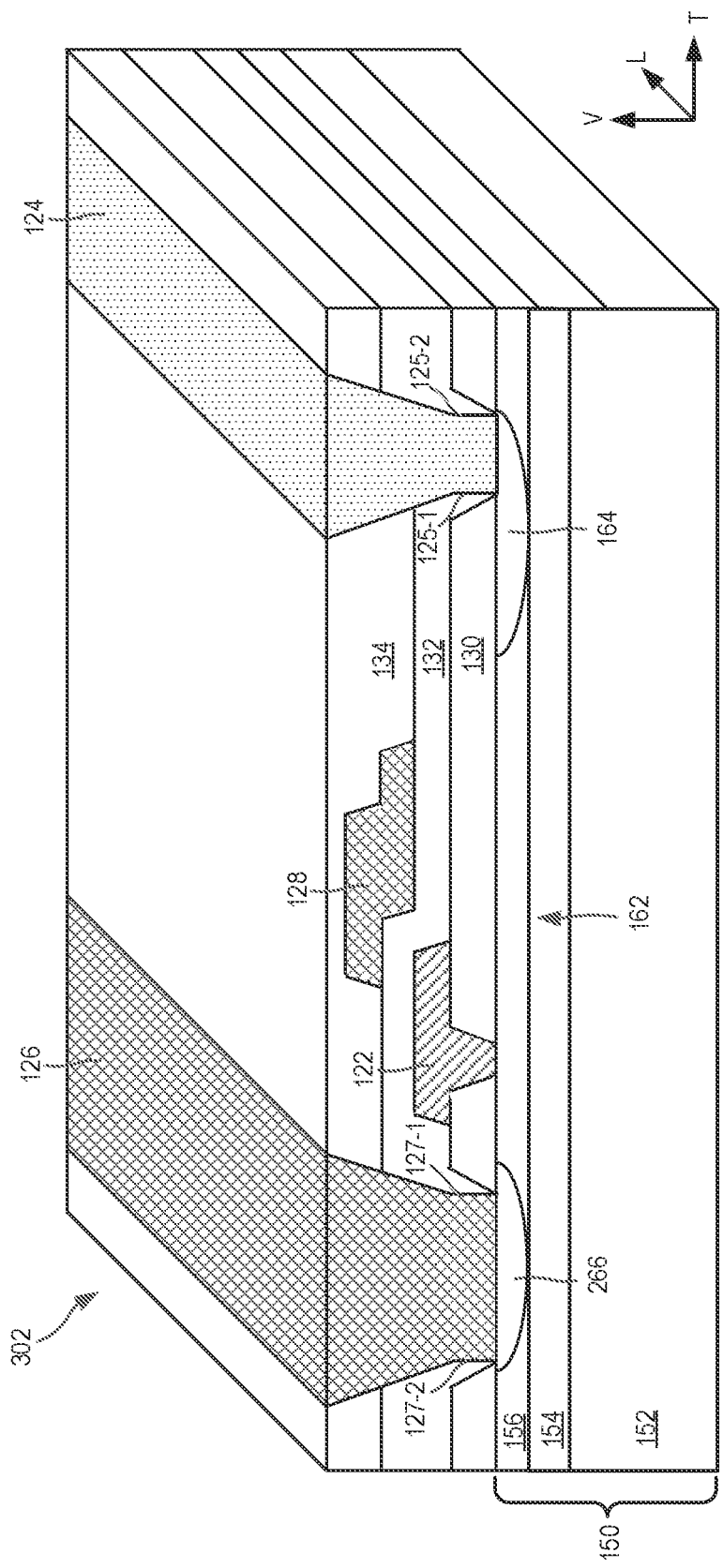
FIG. 5 is a schematic perspective view of a unit cell of a Group III nitride-based RF transistor amplifier die according to still further embodiments of the present invention.

FIG. 5 is a schematic perspective view of a unit cell 302 of a Group III nitride-based RF transistor amplifier die according to still further embodiments of the present invention. The unit cell 302 is very similar to the unit cell 102 of FIGS. 2A-2C, except that the unit cell 302 includes the widened source region 266 of unit cell 202 so that unit cell 302 has both a widened drain region 164 and a widened source region 266. As all aspects of unit cell 302 have been discussed above with respect to either unit cell 102 or unit cell 202, further description thereof will be omitted.

The techniques disclosed above may be particularly advantageous in implementations where the RF transistor amplifier is implemented as a monolithic microwave integrated circuit (MMIC). A MMIC refers to an integrated circuit that operates on radio and/or microwave frequency signals in which all of the circuitry for a particular function is integrated into a single semiconductor chip. An example MMIC device is a transistor amplifier that includes associated matching circuits, feed networks and the like that are all implemented on a common substrate. MMIC RF transistor amplifiers typically include a plurality of unit cell HEMT transistors that are connected in parallel.

Figure 6:
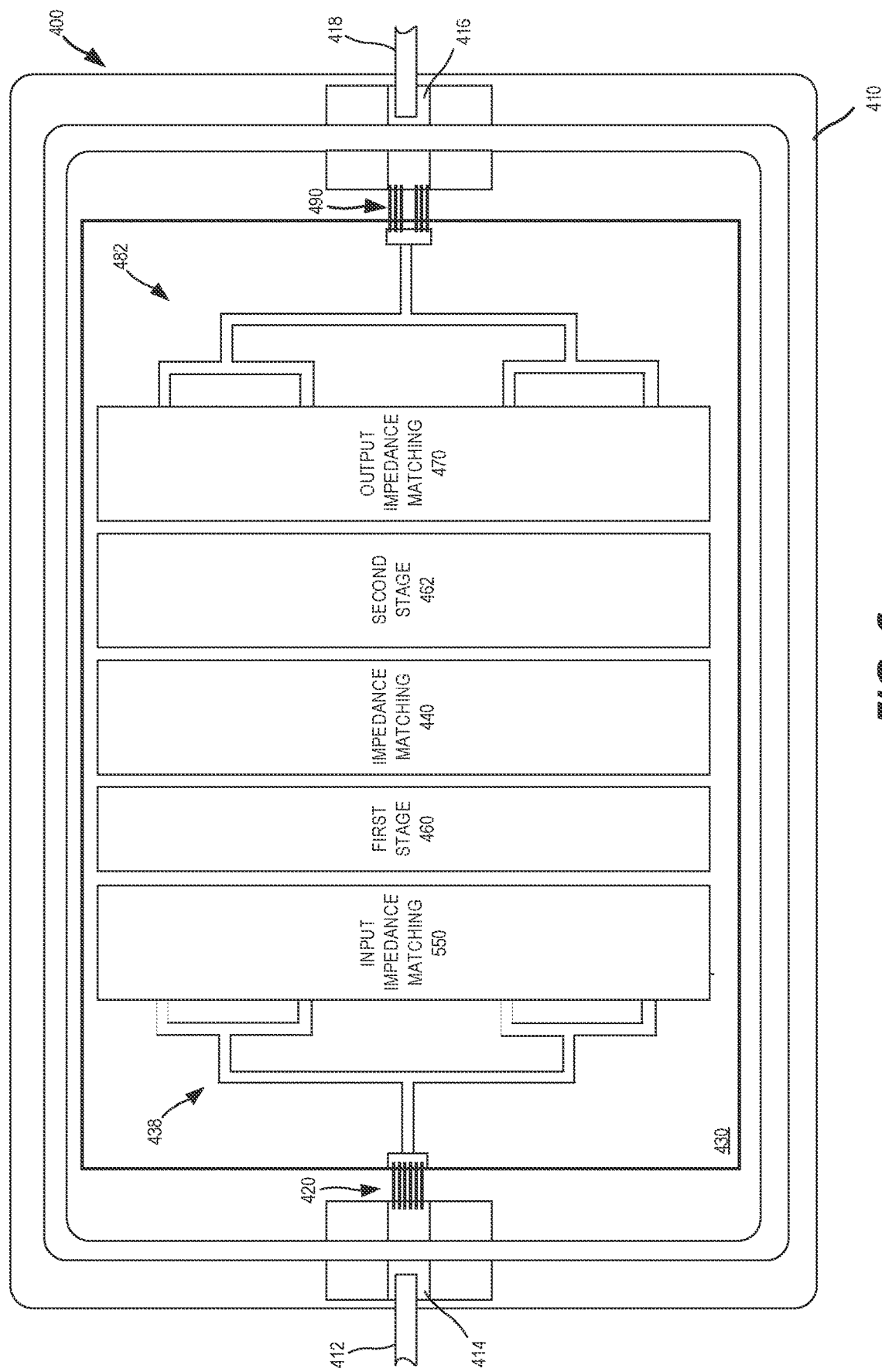
FIG. 6 is a schematic plan view of a monolithic microwave integrated circuit RF transistor amplifier according to embodiments of the present invention.

FIG. 6 is a plan view of a MMIC RF transistor amplifier 400 according to embodiments of the present invention. As shown in FIG. 6, the MMIC RF transistor amplifier 400 includes an integrated circuit chip 430 that is contained within a package 410. The package 410 may comprise a protective housing that surrounds and protects the integrated circuit chip 430. The package 410 may be formed of, for example, a ceramic material. The package 410 includes an input lead 412 and an output lead 418. The input lead 412 may be mounted to an input lead pad 414 by, for example, soldering. One or more input bond wires 420 may electrically connect the input lead pad 414 to an input bond pad on the integrated circuit chip 430.

The integrated circuit chip 430 includes an input feed network 438, an input impedance matching network 450, a first RF transistor amplifier stage 460, an intermediate impedance matching network 440, a second RF transistor amplifier stage 462, an output impedance matching stage 470, and an output feed network 482. The package 410 further includes an output lead 418 that is connected to an output lead pad 416 by, for example, soldering. One or more output bond wires 490 may electrically connect the output lead pad 416 to an output bond pad on the integrated circuit chip 430. The first RF transistor amplifier stage 460 and/or the second RF transistor amplifier stage 462 may be implemented using any of the RF transistor amplifiers according to embodiments of the present invention.

The RF transistor amplifiers according to embodiments of the present invention may be designed to operate in a wide variety of different frequency bands. In some embodiments, these RF transistor amplifier dies may be configured to operate in at least one of the 0.6-2.7 GHz, 3.4-4.2 GHz, 5.1-5.8 GHz, 12-18 GHz, 18-27 GHz, 27-40 GHz or 40-75 GHz frequency bands or sub-portions thereof. The techniques according to embodiments of the present invention may be particularly advantageous for RF transistor amplifiers that operate at frequencies of 10 GHz and higher.

Figure 7A:
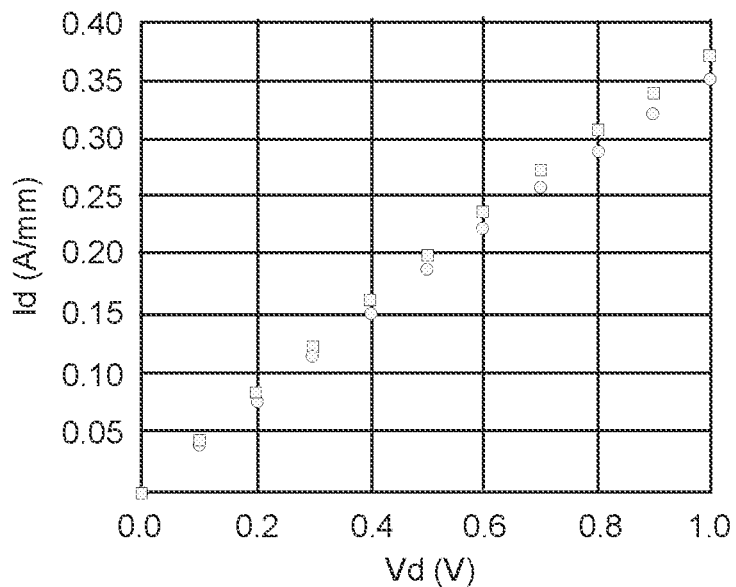
FIG. 7A is a graph of the drain current during on-state operation as a function of the drain voltage for an RF transistor amplifier according to embodiments of the present invention as compared to a conventional RF transistor amplifier.
Figure 7B:
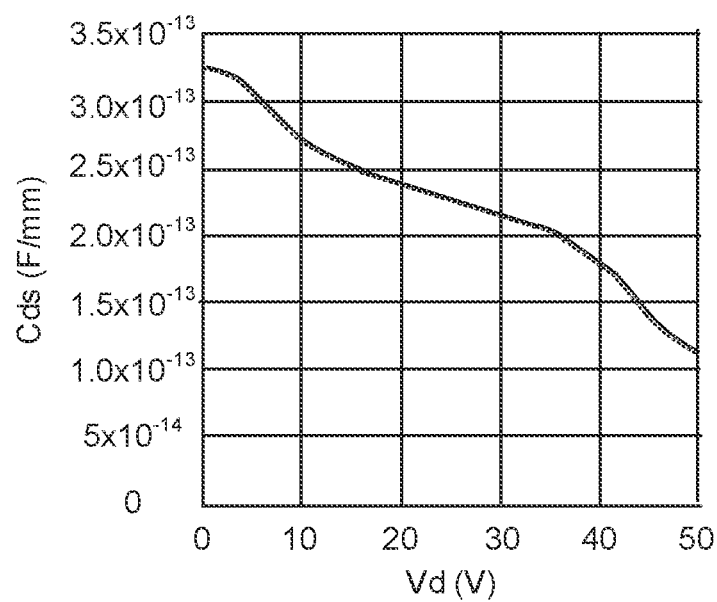
FIG. 7B is a graph of the drain-to-source capacitance response for the two RF transistor amplifiers used to generate FIG. 7A.

FIGS. 7A and 7B are graphs that illustrate the simulated performance of the RF transistor amplifier of FIGS. 2A-3C. In particular, FIG. 7A is a graph of the drain current Id during on-state operation as a function of the drain voltage $V_d$ (which effectively shows the on-state resistance of the device) for the RF transistor amplifier of FIGS. 2A-3C as compared to the conventional RF transistor amplifier of FIG. 1, and FIG. 7B is a graph of the drain-to-source capacitance Cresponse for the two RF transistor amplifiers used to generate FIG. 7A. As can be seen in FIG. 7A, the RF transistor amplifier according to embodiments of the present invention (whose performance is shown by the small squares) exhibits increased drain currents for the same drain voltage as compared to the conventional RF transistor amplifier (whose performance is shown by the small circles). From FIG. 7A it can be seen that a reduction of about 5% in the on-resistance was achieved by widening the drain region to extend an additional 0.4 microns closer to the gate finger. FIG. 7B shows the drain-to-source capacitance response for the two RF transistor amplifiers used to generate FIG. 7A. As shown, the RF transistor amplifier according to embodiments of the present invention (the solid curve) only exhibits a de minimis increase in the drain-to-source capacitance as compared to the conventional RF transistor amplifier.

Figure 8A:
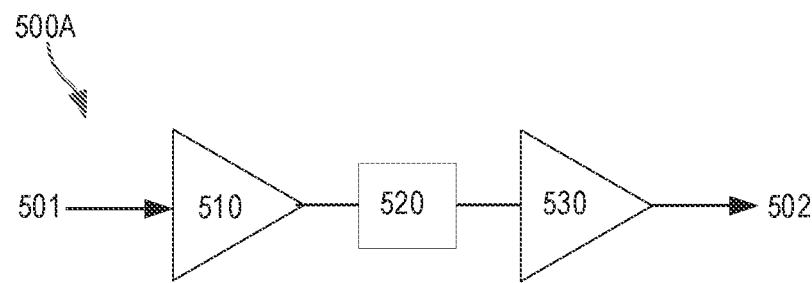
FIGS. 8A-8C are schematic block diagrams of multi-amplifier circuits in which the RF transistor amplifiers according to embodiments of the present invention may be used.
Figure 8B:
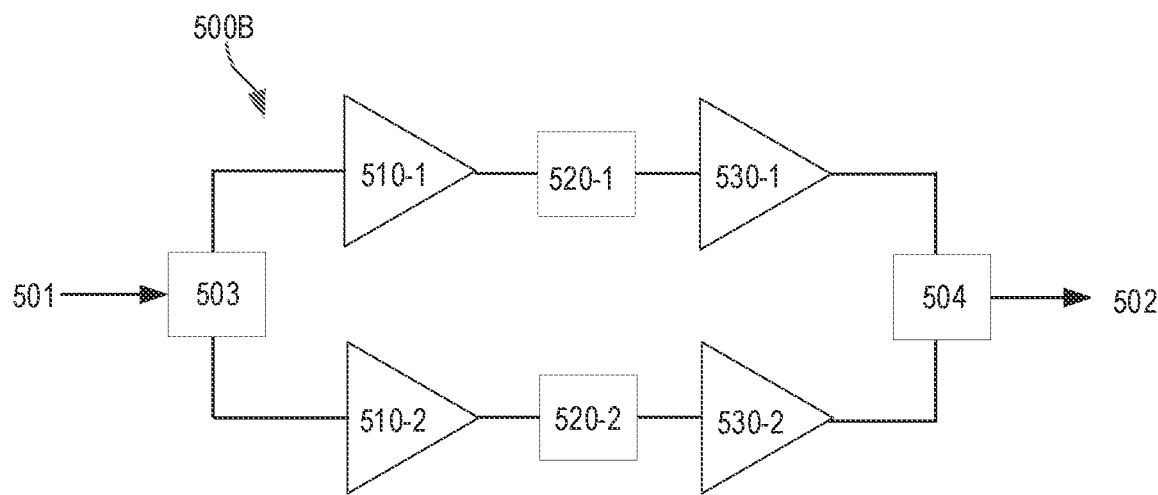
Figure 8C:
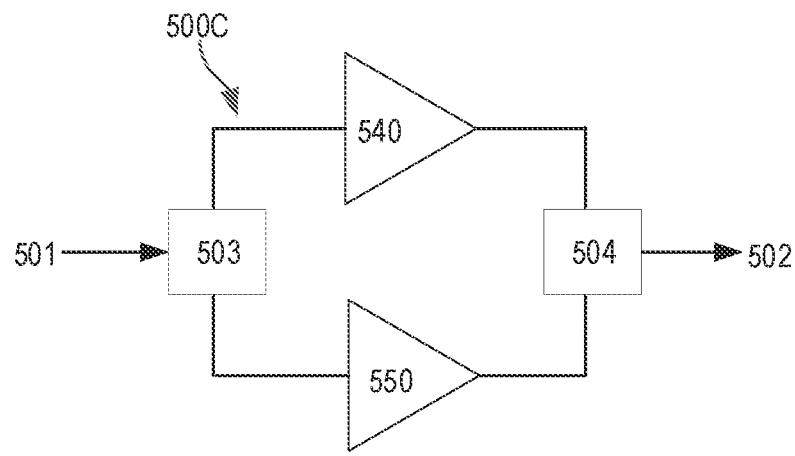

As noted above, the RF transistor amplifiers according to embodiments of the present invention may be particularly useful in MMIC devices that include multiple amplifier stages. FIGS. 8A-8C illustrate several examples of multi-stage MMIC devices in which the techniques according to embodiments of the present invention may be used.

Referring first to FIG. 8A, an RF transistor amplifier 500A is schematically illustrated that includes a pre-amplifier 510 and a main amplifier 530 that are electrically connected in series. As shown in FIG. 8A, RF transistor amplifier 500A includes an RF input 501, the pre-amplifier 510, an inter-stage impedance matching network 520, the main amplifier 530, and an RF output 502. The inter-stage impedance matching network 520 may include, for example, inductors and/or capacitors arranged in any appropriate configuration in order to form a circuit that improves the impedance match between the output of pre-amplifier 510 and the input of main amplifier 530. While not shown in FIG. 8A, RF transistor amplifier 500A may further include an input matching network that is interposed between RF input 501 and pre-amplifier 510, and/or an output matching network that is interposed between the main amplifier 530 and the RF output 502. The RF transistor amplifiers according to embodiments of the present invention may be used to implement either or both of the pre-amplifier 510 and the main amplifier 530.

Referring to FIG. 8B, an RF transistor amplifier 500B is schematically illustrated that includes an RF input 501, a pair of pre-amplifiers 510-1, 510-2, a pair of inter-stage impedance matching networks 520-1, 520-2, a pair of main amplifiers 530-1, 530-2, and an RF output 502. A splitter 503 and a combiner 504 are also provided. Pre-amplifier 510-1 and main amplifier 530-1 (which are electrically connected in series) are arranged electrically in parallel with pre-amplifier 510-2 and main amplifier 530-2 (which are electrically connected in series). As with the RF transistor amplifier 500A of FIG. 8A, RF transistor amplifier 500B may further include an input matching network that is interposed between RF input 501 and pre-amplifiers 510-1, 510-2, and/or an output matching network that is interposed between the main amplifiers 530-1, 530-2 and the RF output 502.

As shown in FIG. 8C, the RF transistor amplifiers according to embodiments of the present invention may also be used to implement Doherty amplifiers. As is known in the art, a Doherty amplifier circuit includes first and second (or more) power-combined amplifiers. The first amplifier is referred to as the "main" or "carrier" amplifier and the second amplifier is referred to as the "peaking" amplifier. The two amplifiers may be biased differently. For example, the main amplifier may comprise a Class AB or a Class B amplifier while the peaking amplifier may be a Class C amplifier in one common Doherty amplifier implementation. The Doherty amplifier may operate more efficiently than balanced amplifiers when operating at power levels that are backed off from saturation. An RF signal input to a Doherty amplifier is split (e.g., using a quadrature coupler), and the outputs of the two amplifiers are combined. The main amplifier is configured to turn on first (i.e., at lower input power levels) and hence only the main amplifier will operate at lower power levels. As the input power level is increased towards saturation, the peaking amplifier turns on and the input RF signal is split between the main and peaking amplifiers.

As shown in FIG. 8C, the Doherty RF transistor amplifier 500C includes an RF input 501, an input splitter 503, a main amplifier 540, a peaking amplifier 550, an output combiner 504 and an RF output 502. The Doherty RF transistor amplifier 500C may optionally include input matching networks and/or an output matching networks (not shown). The main amplifier 540 and/or the peaking amplifier 550 may be implemented using any of the above-described RF transistor amplifiers according to embodiments of the present invention.

Figure 9A:
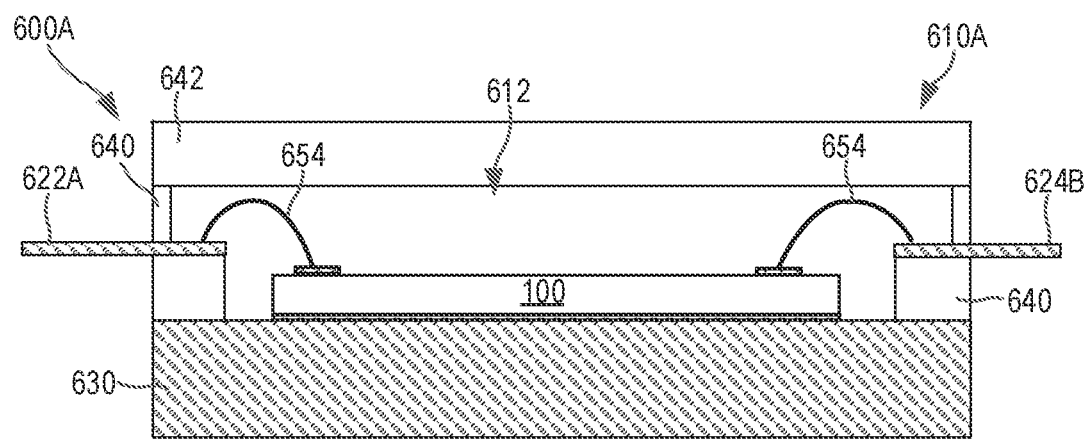
FIGS. 9A and 9B are schematic cross-sectional views illustrating two example ways that that the RF transistor amplifier dies according to embodiments of the present invention may be packaged to provide packaged RF transistor amplifiers.
Figure 9B:
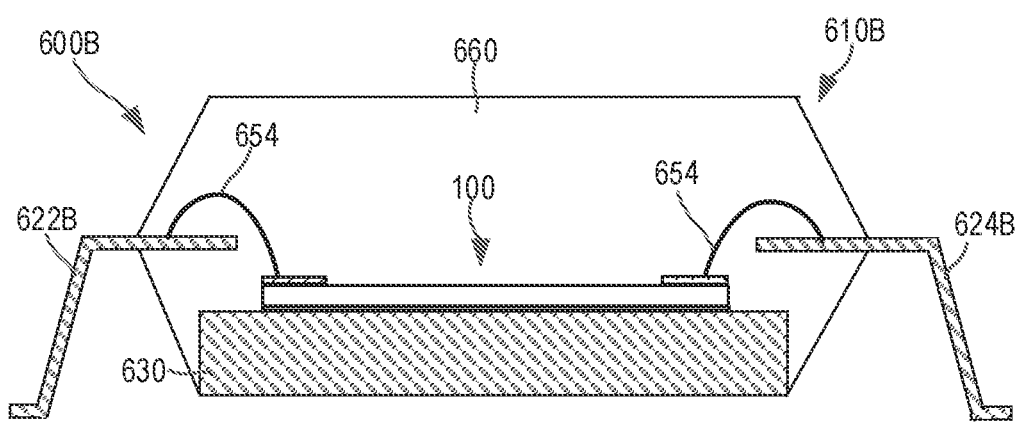

FIGS. 9A and 9B are schematic cross-sectional views illustrating several example ways that that the RF transistor amplifier dies according to embodiments of the present invention may be packaged to provide packaged RF transistor amplifiers 600A and 600B, respectively.

FIG. 9A is a schematic side view of a packaged Group III nitride-based RF transistor amplifier 600A. As shown in FIG. 9A, packaged RF transistor amplifier 600A includes the RF transistor amplifier die 100 packaged in an open cavity package 610A. The package 610A includes metal gate leads 622A, metal drain leads 624A, a metal submount 630, sidewalls 640 and a lid 642.

The submount 630 may include materials configured to assist with the thermal management of the package 600A. For example, the submount 630 may include copper and/or molybdenum. In some embodiments, the submount 630 may be composed of multiple layers and/or contain vias/interconnects. In an example embodiment, the submount 630 may be a multilayer copper/molybdenum/copper metal flange that comprises a core molybdenum layer with copper cladding layers on either major surface thereof. In some embodiments, the submount 630 may include a metal heat sink that is part of a lead frame or metal slug. The sidewalls 640 and/or lid 642 may be formed of or include an insulating material in some embodiments. For example, the sidewalls 640 and/or lid 642 may be formed of or include ceramic materials. In some embodiments, the sidewalls 640 and/or lid 642 may be formed of, for example, $Al_2O_3$. The lid 642 may be glued to the sidewalls 640 using an epoxy glue. The sidewalls 640 may be attached to the submount 630 via, for example, braising. The gate lead 622A and the drain lead 624A may be configured to extend through the sidewalls 640, though embodiments of the present invention are not limited thereto.

The RF transistor amplifier die 100 is mounted on the upper surface of the metal submount 630 in an air-filled cavity 612 defined by the metal submount 630, the ceramic sidewalls 640 and the ceramic lid 642. The gate and drain terminals of RF transistor amplifier die 100 may be on the top side of the semiconductor layer structure 150, while the source terminal is on the bottom side of the semiconductor layer structure 150. The gate lead 622A may be connected to the gate terminal of RF transistor amplifier die 100 by one or more bond wires 654. Similarly, the drain lead 624A may be connected to the drain terminal of RF transistor amplifier die 100 by one or more bond wires 654. The source terminal may be mounted on the metal submount 630 using, for example, a conductive die attach material (not shown). The metal submount 630 may provide the electrical connection to the source terminal 136 and may also serve as a heat dissipation structure that dissipates heat that is generated in the RF transistor amplifier die 100. The heat is primarily generated in the upper portion of the RF transistor amplifier die 100 where relatively high current densities are generated in, for example, the channel regions of the unit cell transistors 102. This heat may be transferred though the source vias 146 and the semiconductor layer structure 150 to the source terminal and then to the metal submount 630.

FIG. 9B is a schematic side view of another packaged Group III nitride-based RF transistor amplifier 600B. RF transistor amplifier 600B differs from RF transistor amplifier 600A in that it includes a different package 610B. The package 610B includes a metal submount 630, as well as metal gate and drain leads 622B, 624B. RF transistor amplifier 600B also includes a plastic overmold 660 that at least partially surrounds the RF transistor amplifier die 100, the leads 622B, 624B, and the metal submount 630. Other components of RF transistor amplifier 600B may be the same as the like-numbered components of RF transistor amplifier 600A and hence further description thereof will be omitted.

While embodiments of the present invention are described above with respect to gallium nitride based RF transistor amplifiers, it will be appreciated that embodiments of the present invention are not limited thereto. For example, the transistors described above may also be used as power transistors in switching and other applications.

Embodiments of the present invention have been described above with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the inventive concepts to those skilled in the art. Like numbers refer to like elements throughout.

In the specification and the figures, two-part reference numbers (i.e., two numbers separated by a dash, such as 100-1) may be used to identify like elements. When such two-part reference numbers are employed, the full reference numeral may be used to refer to a specific instance of the element, while the first part of the reference numeral may be used to refer to the elements collectively.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the terms "comprises," "comprising," "includes" and/or "including" specify the presence of stated features, integers, steps, operations, elements, and/or components, but do not preclude the presence or addition of one or more other features, integers, steps, operations, elements, components, and/or groups thereof.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

In the drawings and specification, there have been disclosed typical embodiments of the invention and, although specific terms are employed, they are used in a generic and descriptive sense only and not for purposes of limitation, the scope of the invention being set forth in the following claims.

That which is claimed is:

1. A transistor, comprising:
   a semiconductor layer structure comprising a gallium nitride-based channel layer and a gallium nitride-based barrier layer that has a higher bandgap than the gallium nitride-based channel layer on an upper surface of the gallium nitride-based channel layer;
   a first source/drain region in the semiconductor layer structure;
   a second source/drain region in the semiconductor layer structure;
   a gate finger on an upper surface of the semiconductor layer structure, the gate finger having a longitudinal axis that extends parallel to the upper surface of the semiconductor layer structure; and
   a first source/drain contact on the first source/drain region and a second source/drain contact on the second source/ drain region, the first source/drain contact having an inner sidewall that faces the second source/drain contact and an outer sidewall opposite the inner sidewall, and the second source/drain contact having an inner sidewall that faces the first source/drain contact and an outer sidewall opposite the inner sidewall, wherein the first source/drain region extends a first distance from a lower edge of the inner sidewall of the first source/drain contact towards the second source/drain region along a transverse axis that extends parallel to a plane defined by the upper surface of the semiconductor layer structure, and extends a second distance from a lower edge of the outer sidewall of the first source/drain contact away from the second source/drain region, where the first distance exceeds the second distance, wherein a location where the first source/drain region has a maximum depth is closer to the lower edge of the inner sidewall of the first source/drain contact than it is to the lower edge of the outer sidewall of the first source/drain contact.

2. The transistor of claim 1, wherein the gate finger is positioned between the first source/drain contact and the second source/drain contact.

3. The transistor of claim 1, wherein the first distance exceeds the second distance by at least 200%.

4. The transistor of claim 1, wherein the second source/drain region extends a third distance along the transverse axis from a lower edge of the inner sidewall of the second source/drain contact towards the first source/drain contact, where the first distance exceeds the third distance by at least 100%.

5. The transistor of claim 1, wherein the first source/drain region has a first width along the transverse axis and the second source/drain region has a second width along the transverse axis, where the first width exceeds the second width.

6. The transistor of claim 2, wherein a ratio of the first distance to a distance between the lower edge of the inner sidewall of the first source/drain contact and a lower edge of a sidewall of the gate finger that faces the first source/drain contact along the transverse axis is at least 0.1.

7. The transistor of claim 1, wherein the first distance is at least 0.3 microns, and wherein a doping density of the first source/drain region is at least $3\times10^{19}$ dopants/cm$^3$.

8. The transistor of claim 1, wherein the first source/drain region is a drain region and the first source/drain contact is a drain contact.

9. A transistor, comprising:
a semiconductor layer structure comprising a gallium nitride-based channel layer and a gallium nitride-based barrier layer that has a higher bandgap than the gallium nitride-based channel layer on an upper surface of the gallium nitride-based channel layer;
a first source/drain region in the semiconductor layer structure;
a second source/drain region in the semiconductor layer structure;
a gate finger on an upper surface of the semiconductor layer structure, the gate finger having a longitudinal axis that extends parallel to the upper surface of the semiconductor layer structure;
a first source/drain contact on the first source/drain region and a second source/drain contact on the second source/drain region, the first source/drain contact having an inner sidewall that faces the second source/drain contact and an outer sidewall opposite the inner sidewall, and the second source/drain contact having an inner sidewall that faces the first source/drain contact and an outer sidewall opposite the inner sidewall; and
a field plate that extends above an upper surface of the gate finger, the field plate being electrically connected to one of the first and second source/drain contacts, wherein the first source/drain region extends a first distance from a lower edge of the inner sidewall of the first source/drain contact towards the second source/drain region along a transverse axis that extends parallel to a plane defined by the upper surface of the semiconductor layer structure, and extends a second distance from a lower edge of the outer sidewall of the first source/drain contact away from the second source/drain region, where the first distance exceeds the second distance, and wherein the first source/drain region does not intersect a first plane that is interposed between the field plate and a lower surface of the first source/drain contact, wherein the first plane is perpendicular to an upper surface of the semiconductor layer structure and perpendicular to the transverse axis.

10. A transistor, comprising:
a semiconductor layer structure comprising a gallium nitride-based channel layer and a gallium nitride-based barrier layer that has a higher bandgap than the gallium nitride-based channel layer on an upper surface of the gallium nitride-based channel layer;
a first source/drain region in the semiconductor layer structure;
a second source/drain region in the semiconductor layer structure; and
a first source/drain contact on the first source/drain region;
wherein a first longitudinal axis extending down a center of an upper surface of the first source/drain region is offset in a transverse direction from a second longitudinal axis extending down a center of a lower surface of the first source/drain contact,
wherein a location of a peak doping density of the first source/drain region is closer to a lower edge of an inner sidewall of the first source/drain contact than it is to a lower edge of an outer sidewall of the first source/drain contact.

11. A transistor, comprising:
a semiconductor layer structure comprising a gallium nitride-based channel layer and a gallium nitride-based barrier layer that has a higher bandgap than the gallium nitride-based channel layer on an upper surface of the gallium nitride-based channel layer;
a first source/drain region in the semiconductor layer structure;
a second source/drain region in the semiconductor layer structure;
a first source/drain contact on the first source/drain region and a second source/drain contact on the second source/drain region, the first source/drain contact having an inner sidewall that faces the second source/drain contact and an outer sidewall opposite the inner sidewall, and the second source/drain contact having an inner sidewall that faces the first source/drain contact and an outer sidewall opposite the inner sidewall,
a gate finger that is positioned between the first source/drain contact and the second source/drain contact; and
an inter-metal insulation layer on an upper surface of the semiconductor layer structure between the gate finger and the first source/drain contact, wherein a center of an upper surface of the first source/drain region is offset from a center of a lower surface of the first source/drain contact in a transverse direction by a first amount and a center of an upper surface of the second source/drain region is offset from a center of a lower surface of the second source/drain contact in a transverse direction by a second amount that is different from the first amount, wherein the center of the upper surface of the first source/drain region directly contacts the inter-metal insulation layer.

12. The transistor of claim 11, wherein the second amount is approximately zero.

13. The transistor of claim 11, wherein the first source/drain contact is a drain contact and the first source/drain region is a drain region.

14. The transistor of claim 11, wherein a width of the first source/drain region along a transverse axis exceeds a width of the second source/drain region along the transverse axis.

15. The transistor of claim 11, wherein a location of a peak doping density of the first source/drain region is closer to a lower edge of the inner sidewall of the first source/drain contact than it is to a lower edge of the outer sidewall of the first source/drain contact.

16. The transistor of claim 11, wherein an inner edge of an upper surface of the first source/drain region is between 0.3 and 0.7 microns from a lower edge of the inner sidewall of the first source/drain contact.

17. The transistor of claim 16, wherein an outer edge of an upper surface of the first source/drain region is less than 0.2 microns from the lower edge of an outer sidewall of the first source/drain contact.

18. The transistor of claim 11, wherein a location where the first source/drain region has a maximum depth is closer to a lower edge of the inner sidewall of the first source/drain contact than it is to a lower edge of the outer sidewall of the first source/drain contact.

19. The transistor of claim 1, wherein the first source/drain region is a drain region, the first source/drain contact is a drain contact, the second source/drain region is a source region, and the second source/drain contact is a source contact, the transistor further comprising a field plate that extends above an upper surface of the gate finger, the field plate being electrically connected to the source contact, wherein the field plate does not vertically overlap the drain region.

20. The transistor of claim 10, wherein the first source/drain region is a drain region, the first source/drain contact is a drain contact, the second source/drain region is a source region, and a second source/drain contact is a source contact.

21. The transistor of claim 20, further comprising a field plate that extends above an upper surface of a gate finger, the field plate being electrically connected to the source contact, wherein the field plate does not vertically overlap the drain region.

22. The transistor of claim 11, wherein the first source/drain region is a drain region, the first source/drain contact is a drain contact, the second source/drain region is a source region, and the second source/drain contact is a source contact, the transistor further comprising a field plate that extends above an upper surface of the gate finger, the field plate being electrically connected to the source contact, wherein the field plate does not vertically overlap the drain region.

23. A transistor, comprising:
a semiconductor layer structure comprising a gallium nitride-based channel layer and a gallium nitride-based barrier layer that has a higher bandgap than the gallium nitride-based channel layer on an upper surface of the gallium nitride-based channel layer;

a drain region in the semiconductor layer structure;

a source region in the semiconductor layer structure;

a gate finger on an upper surface of the semiconductor layer structure, the gate finger having a longitudinal axis that extends parallel to the upper surface of the semiconductor layer structure; and a drain contact on the drain region and a source contact on the source region, the drain contact having an inner sidewall that faces the source contact and an outer sidewall opposite the inner sidewall, and the source contact having an inner sidewall that faces the drain contact and an outer sidewall opposite the inner sidewall, wherein the drain region extends a first distance from a lower edge of the inner sidewall of the drain contact towards the source region along a transverse axis that extends parallel to a plane defined by the upper surface of the semiconductor layer structure, and extends a second distance from a lower edge of the outer sidewall of the drain contact away from the source region, where the first distance exceeds the second distance, wherein a maximum width of the drain region exceeds a maximum width of the source region and neither the source region nor the drain region extends underneath the gate finger.

24. The transistor of claim 23, further comprising a field plate that extends above an upper surface of the gate finger, the field plate being electrically connected to the source contact, wherein the field plate does not vertically overlap the drain region.

25. A transistor, comprising:
a semiconductor layer structure comprising a gallium nitride-based channel layer and a gallium nitride-based barrier layer that has a higher bandgap than the gallium nitride-based channel layer on an upper surface of the gallium nitride-based channel layer;

a drain region in the semiconductor layer structure;

a source region in the semiconductor layer structure;

a gate finger on an upper surface of the semiconductor layer structure, the gate finger having a longitudinal axis that extends parallel to the upper surface of the semiconductor layer structure; and a drain contact on the drain region and a source contact on the source region, the drain contact having an inner sidewall that faces the source contact and an outer sidewall opposite the inner sidewall, and the source contact having an inner sidewall that faces the drain contact and an outer sidewall opposite the inner sidewall, wherein the drain region extends a first distance from a lower edge of the inner sidewall of the drain contact towards the source region along a transverse axis that extends parallel to a plane defined by the upper surface of the semiconductor layer structure, and extends a second distance from a lower edge of the outer sidewall of the drain contact away from the source region, where the first distance exceeds the second distance, wherein the drain region does not extend all of the way to the lower edge of the outer sidewall of the drain contact such that the second distance is a negative number.

26. The transistor of claim 25, further comprising a field plate that extends above an upper surface of the gate finger, the field plate being electrically connected to the source contact, wherein the field plate does not vertically overlap the drain region.

* * * * *

UNITED STATES PATENT AND TRADEMARK OFFICE
CERTIFICATE OF CORRECTION

Page 1 of 1

PATENT NO. : 11,791,389 B2
APPLICATION NO. : 17/144346
DATED : October 17, 2023
INVENTOR(S) : Bothe et al.

It is certified that error appears in the above-identified patent and that said Letters Patent is hereby corrected as shown below:

In the Specification

Column 18, Line 35: Please correct "$Al_xGa_{-x}N$" to read --$Al_xGa_{1-x}N$--

Column 20, Line 16: Please correct "DM" to read --$D_M$--

Column 21, Line 21: Please correct "Cresponse" to read --$C_{ds}$ response--

Signed and Sealed this
Second Day of January, 2024

Katherine Kelly Vidal
*Director of the United States Patent and Trademark Office*